United States Patent
Woo et al.

(10) Patent No.: US 11,735,522 B2
(45) Date of Patent: Aug. 22, 2023

(54) SEMICONDUCTOR DEVICE INCLUDING PLURALITY OF PATTERNS

(71) Applicant: SAMSUNG ELECTRONICS CO., LTD., Suwon-si (KR)

(72) Inventors: Hyoseok Woo, Seongnam-si (KR); Hyunsook Yoon, Hwaseong-si (KR); Jaeeun Lee, Hwaseong-si (KR); Junseok Kim, Seoul (KR)

(73) Assignee: Samsung Electronics Co., Ltd.

( * ) Notice: Subject to any disclaimer, the term of this patent is extended or adjusted under 35 U.S.C. 154(b) by 129 days.

(21) Appl. No.: 17/224,906

(22) Filed: Apr. 7, 2021

(65) Prior Publication Data
US 2022/0059446 A1    Feb. 24, 2022

(30) Foreign Application Priority Data
Aug. 19, 2020   (KR) .................. 10-2020-0104155

(51) Int. Cl.
*H01L 23/528*    (2006.01)
*H01L 23/522*    (2006.01)

(52) U.S. Cl.
CPC ........ *H01L 23/528* (2013.01); *H01L 23/5226* (2013.01)

(58) Field of Classification Search
CPC ............... H01L 23/528; H01L 23/5226; H01L 27/0207; H01L 23/5283; H01L 23/522; H01L 23/525; H01L 23/53209; H01L 23/047; H01L 23/057
See application file for complete search history.

(56) References Cited

U.S. PATENT DOCUMENTS

| | | | |
|---|---|---|---|
| 6,197,452 B1 | 3/2001 | Matumoto | |
| 6,614,049 B1 * | 9/2003 | Koyama | H01L 22/34 257/776 |
| 7,709,967 B2 | 5/2010 | Dunham et al. | |
| 8,299,619 B2 * | 10/2012 | Watanabe | H01L 23/5226 257/776 |
| 8,604,505 B2 | 12/2013 | Kuroda et al. | |
| 8,963,332 B2 * | 2/2015 | Kim | H01L 28/86 257/773 |
| 9,059,165 B2 | 6/2015 | Nagase et al. | |
| 9,576,905 B2 | 2/2017 | Ishikura et al. | |
| 10,211,089 B2 | 2/2019 | Cho et al. | |

(Continued)

FOREIGN PATENT DOCUMENTS

KR    100309301 B1    11/2001
KR    20100105988 A   10/2010

*Primary Examiner* — Galina G Yushina
(74) *Attorney, Agent, or Firm* — Myers Bigel, P.A.

(57) ABSTRACT

A semiconductor device includes a first metal wiring pattern area, and a second metal wiring pattern area that does not overlap the first metal wiring pattern area in a plan view. The first metal wiring pattern area includes a first pattern, the second metal wiring pattern area includes a second pattern that is spaced apart from the first pattern and includes one or more lines. The first metal wiring pattern area includes an assist pattern comprising one or more lines. The assist pattern is spaced apart from the second pattern, parallel with the second pattern, and is between the first pattern and the second pattern. One end of the assist pattern is connected to the first pattern.

20 Claims, 20 Drawing Sheets

(56) References Cited

U.S. PATENT DOCUMENTS

| | | | |
|---|---|---|---|
| 2015/0279781 A1* | 10/2015 | Kaibara | H01L 23/4824 |
| | | | 257/775 |
| 2017/0263550 A1* | 9/2017 | Nishida | H01L 23/5226 |
| 2019/0318989 A1* | 10/2019 | Shao | H01L 21/76802 |
| 2020/0066578 A1 | 2/2020 | Light et al. | |

* cited by examiner

SEMICONDUCTOR DEVICE INCLUDING PLURALITY OF PATTERNS

CROSS-REFERENCE TO RELATED APPLICATION

This application is based on and claims priority under 35 U. S. C. § 119 to Korean Patent Application No. 10-2020-0104155, filed on Aug. 19, 2020, in the Korean Intellectual Property Office, the disclosure of which is incorporated by reference herein in its entirety.

BACKGROUND

The inventive concept relates to a semiconductor device, and more particularly, to a semiconductor device including a plurality of patterns.

The semiconductor device may include a plurality of patterns. As semiconductor devices have become highly integrated, a plurality of patterns adhere to one another due to a light interference phenomenon occurring in an exposure process. For example, when the plurality of patterns are wiring patterns, the plurality of patterns may adhere to one another, and thus, a short circuit may occur.

SUMMARY

The inventive concept relates to a reliable semiconductor device in which a plurality of patterns do not adhere to one another.

According to some embodiments of the inventive concept, there is provided a semiconductor device including a first metal wiring pattern area and a second metal wiring pattern area that does not overlap the first metal wiring pattern area in a plan view. The first metal wiring pattern area includes a first pattern. The second metal wiring pattern area includes a second pattern that is spaced apart from the first pattern and includes one or more lines. The first metal wiring pattern area includes an assist pattern that includes one or more lines. The assist pattern is spaced apart from the second pattern, is parallel with the second pattern, and is between the first pattern and the second pattern. One end of the assist pattern is connected to the first pattern.

According to some embodiments of the inventive concept, there is provided a semiconductor device including a first metal wiring pattern area and a second metal wiring pattern area that does not overlap the first metal wiring pattern area in a plan view and includes a second pattern that includes one or more lines. The first metal wiring pattern area includes a first sub-pattern area including a first pattern and a second sub-pattern area that is adjacent to the first sub-pattern area. The second sub-pattern area includes an assist pattern including one or more lines that are in parallel with the second pattern and are connected to the first pattern.

According to some embodiments of the inventive concept, there is provided a semiconductor device, including a first metal wiring pattern area and a second metal wiring pattern area that does not overlap the first metal wiring pattern area in a plan view. The first metal wiring pattern area includes a first pattern that includes a block. The second metal wiring pattern area includes a second pattern that is spaced apart from the first pattern in a first direction and the second pattern includes a plurality of sub-patterns that include a plurality of lines spaced apart from each other in a second direction perpendicular to the first direction. The first metal wiring pattern area includes an assist pattern that is between the first pattern and the second pattern in the first direction. The assist pattern includes a plurality of sub-assist patterns that include a plurality of lines in parallel with the sub-patterns of the second pattern in the first direction, and spaced apart from each other in the second direction. The plurality of sub-assist patterns are connected to the first pattern.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments of the inventive concept will be described in detail with reference to the accompanying drawings. Hereinafter, the embodiments are separately described. However, the inventive concept may be formed by one of the embodiments or a combination of a plurality of embodiments among the embodiments.

In the following embodiments, the term "area" may be referred to as a "region".

Embodiment 1

Figure 1:
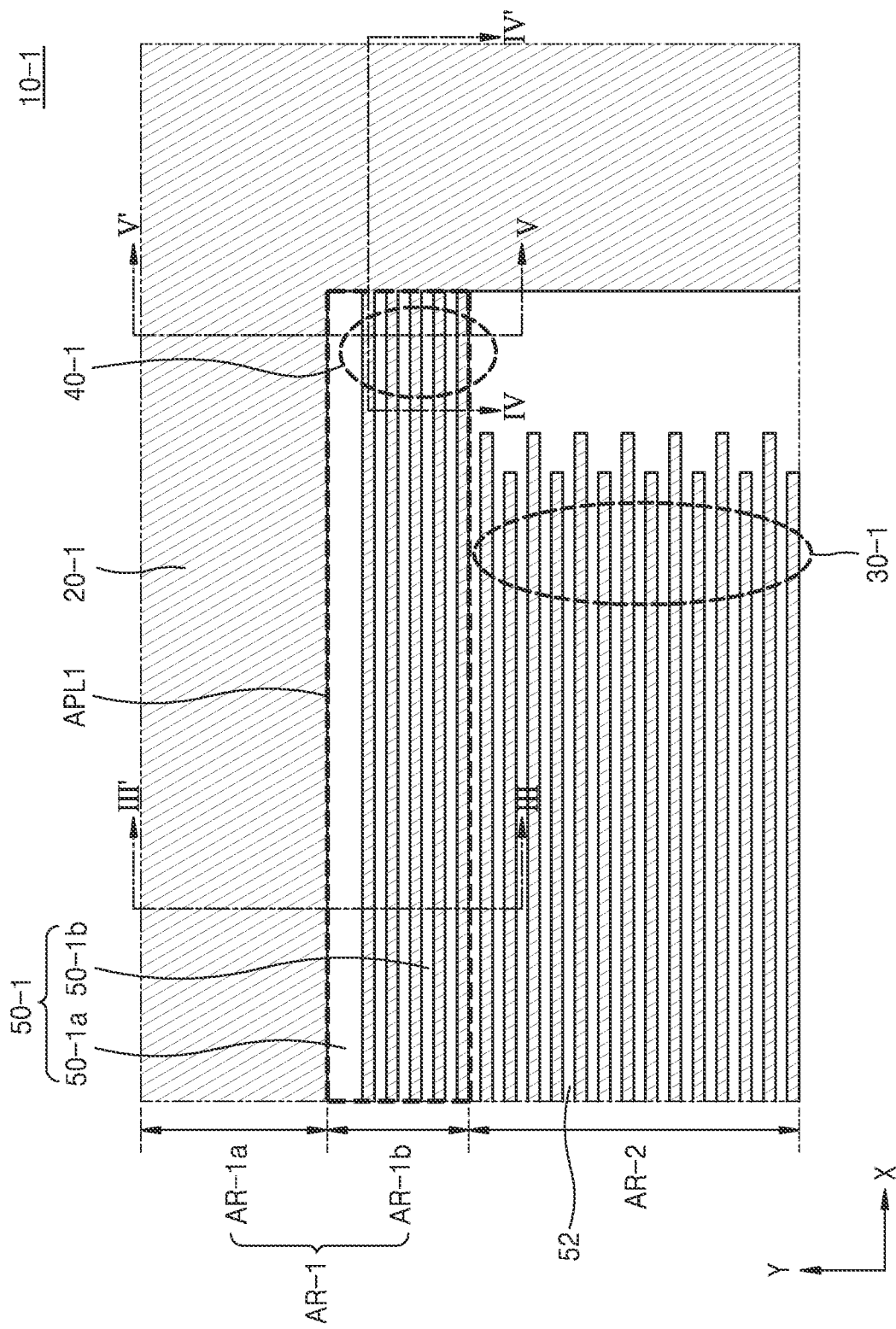
FIGS. 1 and 2 are layout diagrams (i.e., a plan view) illustrating a semiconductor device according to some embodiments of the inventive concept.
Figure 2:
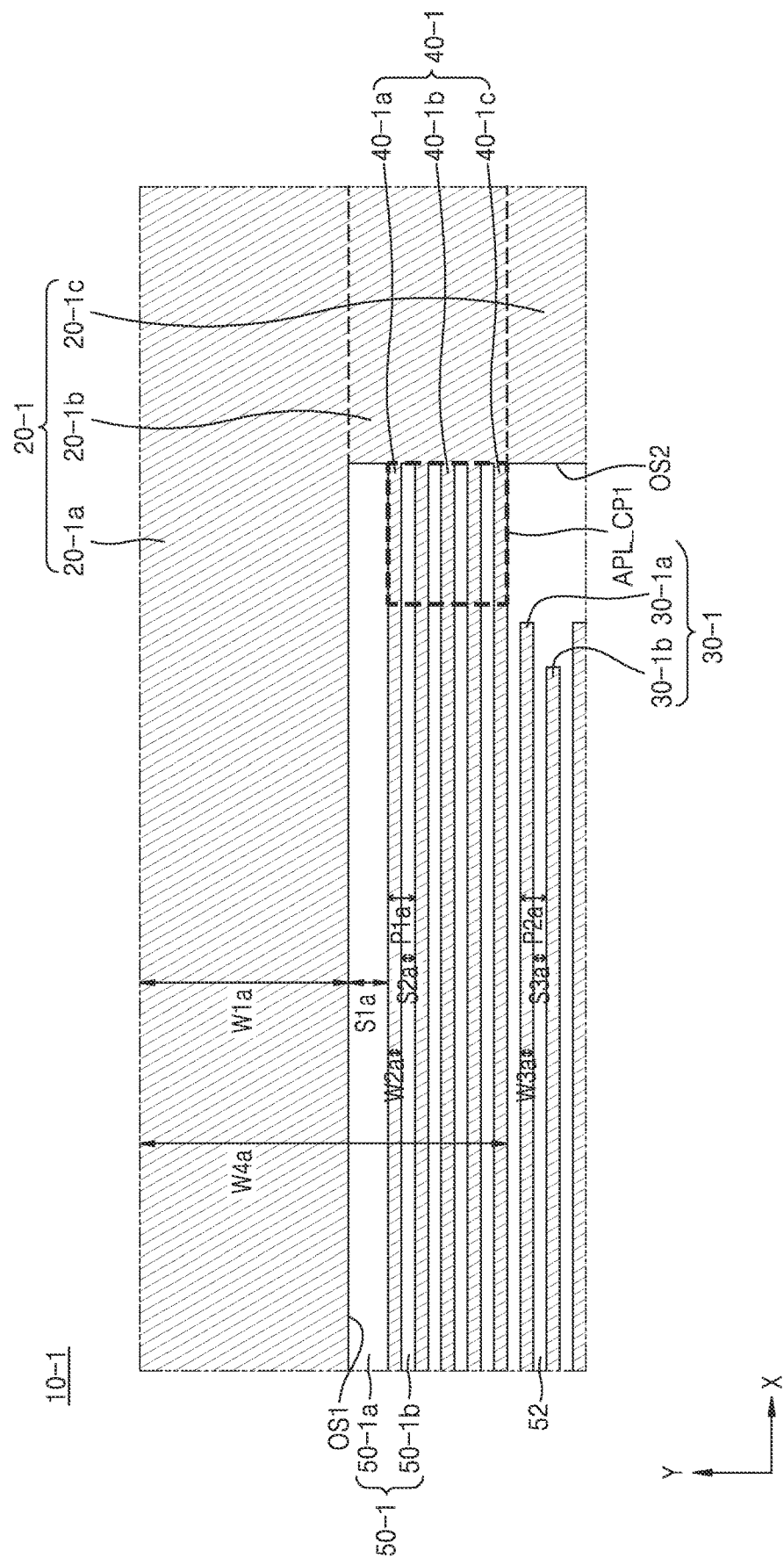

FIGS. 1 and 2 are layout diagrams illustrating a semiconductor device 10-1 according to some embodiments of the inventive concept.

Specifically, FIG. 2 is a view of a partial area of FIG. 1 illustrating the semiconductor device 10-1 of FIG. 2. In FIGS. 1 and 2, an X-Y plane may be parallel with a semiconductor substrate (SL1 of FIGS. 3 to 5). The semiconductor device 10-1 may include a first pattern 20-1, a second pattern 30-1, and a first assist pattern 40-1.

The first assist pattern 40-1 may prevent the second pattern 30-1 from adhering to the first pattern 20-1. The first assist pattern 40-1 may be referred to as a slit pattern. The first assist pattern 40-1 may be referred to as a dummy pattern. The first assist pattern 40-1 may be referred to as a first reinforcement pattern or a first auxiliary pattern.

In some embodiments, the first pattern 20-1, the second pattern 30-1, and the first assist pattern 40-1 may be wiring patterns. The first pattern 20-1, the second pattern 30-1, and the first assist pattern 40-1 may be metal patterns.

In some embodiments, the first pattern 20-1, the second pattern 30-1, and the first assist pattern 40-1 may include an element selected from silver (Ag), gold (Au), nickel (Ni), platinum (Pt), palladium (Pd), iridium (Ir), rhodium (Rh), tantalum (Ta), tungsten (W), titanium (Ti), molybdenum (Mo), aluminum (Al), and copper (Cu) or an alloy material or a compound material using the element as an ingredient.

In the following embodiments, the first pattern 20-1, the second pattern 30-1, and the first assist pattern 40-1 are mainly described by using a wiring pattern or a metal pattern. However, the inventive concept is not limited thereto.

The semiconductor device 10-1 may include a first metal wiring pattern area AR-1 including the first pattern 20-1 and the first assist pattern 40-1 in the form of a line (i.e., including one or more lines) and a second metal wiring pattern area AR-2 including the second pattern 30-1 in the form of a line (i.e., including one or more lines). The first metal wiring pattern area AR-1 may include a first sub-pattern area AR-1a including the first pattern 20-1 and a second sub-pattern area AR-1b including the first assist pattern 40-1. The second sub-pattern area AR-1b including the first assist pattern 40-1 and the second metal wiring pattern area AR-2 including the second pattern 30-1 may be line and space pattern areas that include lines that are spaced apart from one another.

The first sub-pattern area AR-1a may include the first pattern 20-1 in the form of a block. The block may be in the shape of a rectangular solid with a length, width, and depth. The second sub-pattern area AR-1b may include a first assist pattern area APL1. That is, the first assist pattern area APL1 may be arranged in a partial area of the first metal wiring pattern area AR-1.

The first assist pattern area APL1 may be arranged in parallel with the second pattern 30-1. The first assist pattern area APL1 includes the first assist pattern 40-1 connected to the first pattern 20-1. The first assist pattern area APL1 may be arranged in order to control a difference between second pattern density of the second metal wiring pattern area AR-2 and first pattern density of the second sub-pattern area AR-1b adjacent to the second metal wiring pattern area AR-2.

The first assist pattern 40-1 may be for preventing light interference between the second metal wiring pattern area AR-2 and the first sub-pattern area AR-1a during an exposure process. The second metal wiring pattern area AR-2 may be apart from the first metal wiring pattern area AR-1 in a Y direction.

Here, components of the semiconductor device 10-1 will be described in detail.

The first pattern 20-1 may be in the form of a block having a uniform area, for example, a square area. The first pattern 20-1 may include a first portion 20-1a extending in an X direction (that is, a first direction) and a second portion 20-1b and a third portion 20-1c extending in the Y direction (that is, a second direction) perpendicular to the X direction. The second portion 20-1b and the third portion 20-1c may adhere to each other.

A first voltage may be applied to the first pattern 20-1 when an operation of the semiconductor device 10-1 is tested. The first pattern 20-1 may have first and second inner circumferences OS1 and OS2. The first pattern 20-1 may include the first inner circumference OS1 of the first portion 20-1a and the second inner circumference OS2 of the second and third portions 20-1b and 20-1c.

The second pattern 30-1 is apart from the first pattern 20-1 with the first assist pattern 40-1 interposed. The second pattern 30-1 is apart from the first portion 20-1a of the first pattern 20-1 in the Y direction. The second pattern 30-1 is apart from the third portion 20-1c of the first pattern 20-1 in the X direction.

One end of the second pattern 30-1 is apart from the second inner circumference OS2 of the third portion 20-1c of the first pattern 20-1. The second pattern 30-1 is arranged in the form of a line extending in the X direction. The second pattern 30-1 may include first and second sub-patterns 30-1a and 30-1b spaced apart from each other in the Y direction. The second patterns 30-1 may include the first sub-patterns 30-1a and the second sub-patterns 30-1b.

A second separation layer 52 may be formed between the first sub-patterns 30-1a and the second sub-patterns 30-1b. The second separation layer 52 may be an insulating layer, for example, an oxide layer or a nitride layer. A second voltage different from the first voltage applied to the first pattern 20-1 may be applied to each of the first and second sub-patterns 30-1a and 30-1b.

Because the second voltage must be applied to each of the first and second sub-patterns 30-1a and 30-1b, the first and second sub-patterns 30-1a and 30-1b must not adhere to each other not to be shorted. In FIG. 1, the number of first and second sub-patterns 30-1a and 30-1b that form the second pattern 30-1 is illustrated as 14. However, the inventive concept is not limited thereto.

The first sub-patterns 30-1a may extend in the X direction to be longer than the second sub-patterns 30-1b. The first sub-patterns 30-1a and the second sub-patterns 30-1b may be alternately arranged in the Y direction. One end of each of the first and second sub-patterns 30-1a and 30-1b is arranged in zigzags. When the first sub-patterns 30-1a and the second sub-patterns 30-1b are alternately arranged in the Y direction, it is possible to prevent the first sub-patterns 30-1a and the second sub-patterns 30-1b from adhering to each other at one end in the X direction by the exposure process and a developing process.

The first assist pattern 40-1 may be positioned between the first pattern 20-1 and the second pattern 30-1 in the Y direction. The first assist pattern 40-1 is formed in a line parallel with the second pattern 30-1 and is connected to the first pattern 20-1. One end of the first assist pattern 40-1 may be connected to the second inner circumference OS2 of the first pattern 20-1. The first assist pattern 40-1 may include a first assist connection portion APL_CP1 connected to the first pattern 20-1.

The first assist pattern 40-1 may include first to third sub-assist patterns 40-1a, 40-1b, and 40-1c spaced apart from each other in the form of lines. In FIG. 1, the number of first to third sub-assist patterns 40-1a, 40-1b, and 40-1c that form the first assist pattern 40-1 is illustrated as 5. However, the inventive concept is not limited thereto.

The first to third sub-assist patterns 40-1a, 40-1b, and 40-1c may be separated from each other by a first separation layer 50-1. The first separation layer 50-1 may be an insulating layer, for example, an oxide layer or a nitride layer. The first separation layer 50-1 may include a first sub-separation layer 50-1a and a second sub-separation layer 50-1b.

The first sub-assist pattern 40-1a is closest to the first portion 20-1a of the first pattern 20-1. The third sub-assist pattern 40-1c is closest to the first sub-pattern 30-1a of the second pattern 30-1. The second sub-assist pattern 40-1b is positioned between the first sub-assist pattern 40-1a and the third sub-assist pattern 40-1c in the Y direction.

The first sub-separation layer 50-1a may be positioned between the first portion 20-1a of the first pattern 20-1 and the first sub-assist pattern 40-1a. The first sub-separation layer 50-1a may be positioned between the first inner circumference OS1 of the first portion 20-1a of the first pattern 20-1 and the first sub-assist pattern 40-1a. The second sub-separation layer 50-1b may be positioned between the first sub-assist pattern 40-1a and the second sub-assist pattern 40-1b and between the second sub-assist pattern 40-1b and the third sub-assist pattern 40-1c.

The first to third sub-assist patterns 40-1a, 40-1b, and 40-1c may be arranged in parallel with the first and second sub-patterns 30-1a and 30-1b of the second pattern 30-1 in the form of lines. The first to third sub-assist patterns 40-1a, 40-1b, and 40-1c may be connected to the second portion 20-1b of the first pattern 20-1. The first to third sub-assist patterns 40-1a, 40-1b, and 40-1c may be connected to the second inner circumference OS2 of the first pattern 20-1. Since the first to third sub-assist patterns 40-1a, 40-1b, and 40-1c are formed in the Y direction, the second pattern density of the second pattern 30-1 does not rapidly change along the lines so that the second pattern 30-1 may be precisely formed.

As illustrated in FIG. 2, the first sub-pattern 30-1a of the second pattern 30-1 and the third sub-assist pattern 40-1c closest to the first sub-pattern 30-1a may not adhere to each other by arrangements of the first to third sub-assist patterns 40-1a, 40-1b, and 40-1c. Although the first sub-assist pattern 40-1a and the second sub-assist pattern 40-1b do not adhere to each other, because the first and second sub-assist patterns 40-1a and 40-1b are connected to the first pattern 20-1, the first pattern 20-1 and the second pattern 30-1 may independently apply the first voltage and the second voltage, respectively.

Here, an arrangement structure such as widths, intervals, and pitches of the first pattern 20-1, the second pattern 30-1, and the first assist pattern 40-1 will be described.

First, the first portion 20-1a of the first pattern 20-1 may have a first width W1a in the Y direction. In some embodiments, the first width W1a may be 100 μm to 300 μm. The first portion 20-1a of the first pattern 20-1 may be apart from the first sub-assist pattern 40-1a by a first distance S1a. In some embodiments, the first distance S1a may be 0.3 μm to 0.6 μm.

Each of the first to third sub-assist patterns 40-1a, 40-1b, and 40-1c that form the first assist pattern 40-1 may have a second width W2a in the Y direction. The first portion 20-1a of the first pattern 20-1 and the first assist pattern 40-1 collectively may have a fourth width W4a in the Y direction. The first to third sub-assist patterns 40-1a, 40-1b, and 40-1c may be apart from adjacent ones of each other by a second distance S2a.

That is, the first sub-assist pattern 40-1a and the second sub-assist pattern 40-1b of the first assist pattern 40-1 may be spaced apart from each other by the second distance S2a, if they are adjacent to one another. The second sub-assist pattern 40-1b and the third sub-assist pattern 40-1c of the first assist pattern 40-1 may be spaced apart from each other by the second distance S2a. In the first to third sub-assist patterns 40-1a, 40-1b, and 40-1c, one of the second width W2a and the second distance S2a may be a minimum feature size. The first to third sub-assist patterns 40-1a, 40-1b, and 40-1c may be arranged in a second direction at a first pitch P1a.

Each of the first and second sub-patterns 30-1a and 30-1b that form the second pattern 30-1 may have a third width W3a in the Y direction. The first and second sub-patterns 30-1a and 30-1b of the second pattern 30-1 may be spaced apart from adjacent ones of each other by a third distance S3a. In the first and second sub-patterns 30-1a and 30-1b, one of the third width W3a and the third distance S3a may be a minimum feature size. The first and second sub-patterns 30-1a and 30-1b may be arranged in the second direction at a second pitch P2a.

In some embodiments, the first width W1a may be greater than the second width W2a of the first assist pattern 40-1 and/or the third width W3a of the second pattern 30-1 in the Y direction. The first width W1a of the first pattern 20-1, for example, the first portion 20-1a may be greater than the second width W2a of the first assist pattern 40-1 and/or the third width W3a of the second pattern 30-1 in the Y direction and may be referred to as a wide pattern.

The first assist pattern 40-1 and the second pattern 30-1 may be in the form of lines extending in the X direction. The second width W2a of the first assist pattern 40-1 and/or the third width W3a of the second pattern 30-1 may be less than the first width W1a of the first pattern 20-1, for example, the first portion 20-1a and may be referred to as a narrow pattern.

In some embodiments, the first distance S1a may be greater than the second distance S2a and the third distance S3a. When the first distance S1a is greater than the second distance S2a and the third distance S3a, during manufacturing processes, the first pattern 20-1 adjacent to the first sub-assist pattern 40-1a may be more precisely formed.

In some embodiments, the second width W2a may be equal to the third width W3a. The second distance S2a may be equal to the third distance S3a. The first pitch P1a may be equal to the second pitch P2a. In some embodiments, the second width W2a and the third width W3a may be 0.1 μm to 0.2 μm. The second distance S2a and the third distance S3a may be 0.1 μm to 0.2 μm.

When the second width W2a is equal to the third width W3a, the second distance S2a is equal to the third distance S3a, and the first pitch P1a is equal to the second pitch P2a, pattern uniformity between the second metal wiring pattern area AR-2 and the second sub-pattern area AR-1b may improve so that the second pattern 30-1 and the first pattern 20-1 may be precisely formed.

In some embodiments, the first width W1a of the first pattern 20-1, for example, the first portion 20-1a, may be no less than 100 times a minimum feature size of the first assist pattern 40-1 and/or the second pattern 30-1 in the Y direction, for example, one of the second width W2a, the second distance S2a, the third width W3a, or the third distance S3a.

In some embodiments, the fourth width W4a including the first portion 20-1a of the first pattern 20-1 and the first assist pattern 40-1 may be no less than 100 times the minimum feature size of the first assist pattern 40-1 and/or the second pattern 30-1 in the Y direction, for example, one of the second width W2a, the second distance S2a, the third width W3a, or the third distance S3a.

The semiconductor device 10-1 having the above layout includes the second sub-pattern area AR-1b including the first assist pattern 40-1 and connects the first assist pattern 40-1 to the first pattern 20-1. In the semiconductor device 10-1, although the first assist pattern 40-1 adheres to the first pattern 20-1, the first pattern 20-1 does not adhere to the second pattern 30-1 so that the first pattern 20-1 and the second pattern 30-1 may independently apply voltages.

Therefore, the semiconductor device 10-1 may improve element reliability by including the first pattern 20-1 and the second pattern 30-1 that do not adhere to each other. In particular, because the first pattern 20-1 and the second pattern 30-1 are not shorted, the element reliability may remarkably improve.

Figure 3:
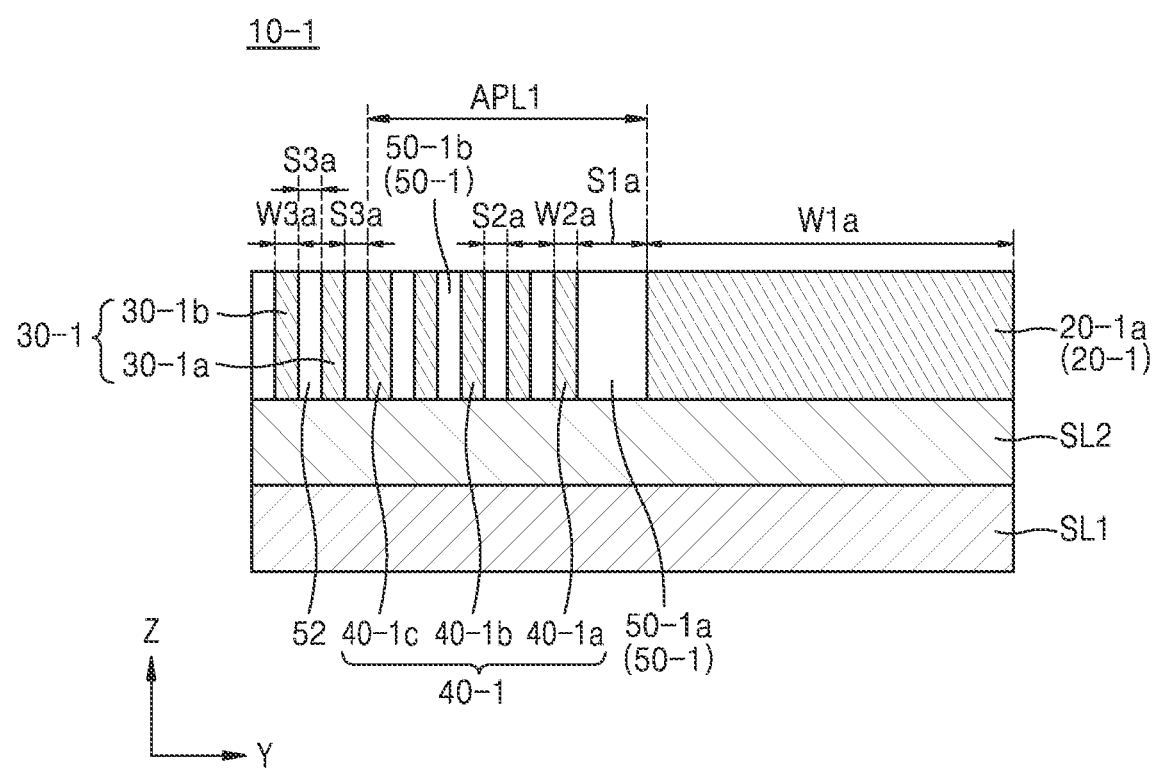
FIGS. 3 to 5 are cross-sectional views each illustrating a main portion of a semiconductor device respectively taken along lines IV-IV', and V-V of FIG. 1.
Figure 4:
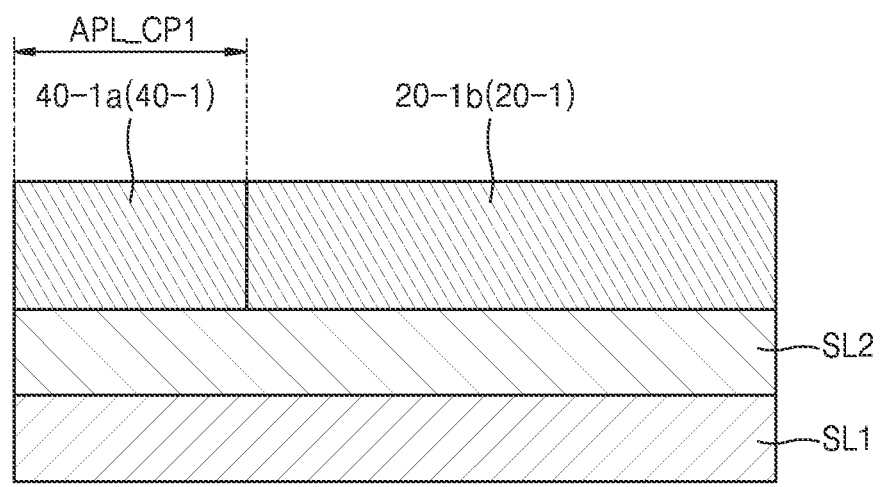
Figure 5:
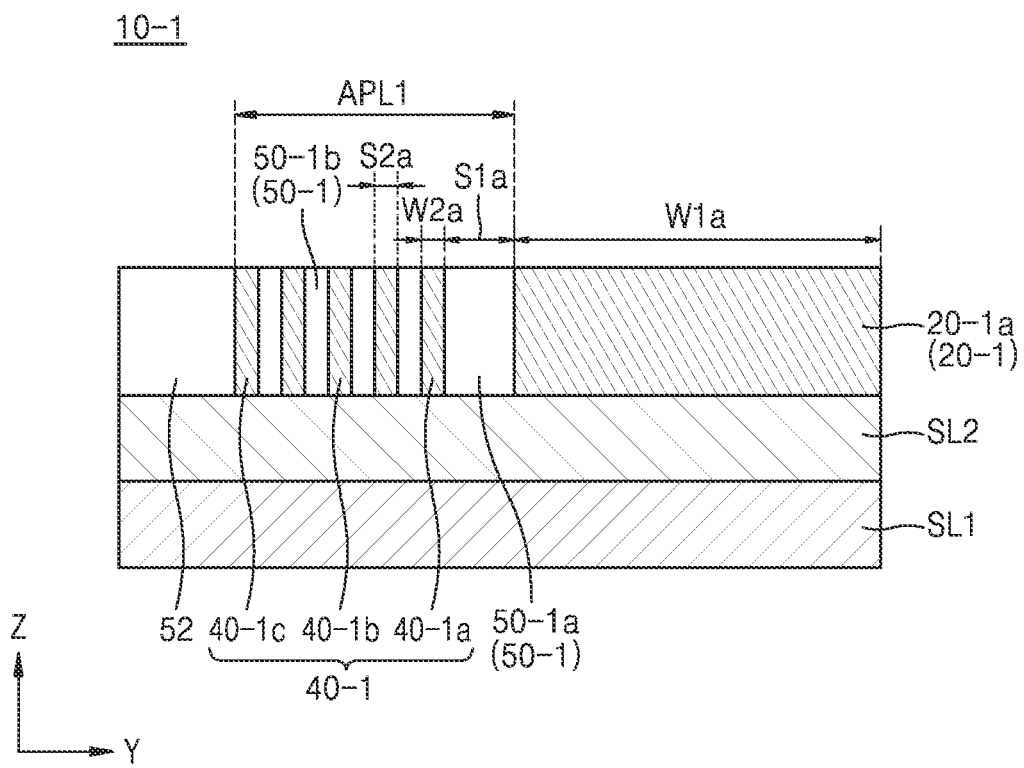

FIGS. 3 to 5 are cross-sectional views each illustrating a main portion of the semiconductor device 10-1 taken along each of the lines IV-IV', and V-V of FIG. 1.

Specifically, in FIGS. 3 to 5, the same reference numerals as those of FIGS. 1 and 2 denote the same elements. In FIGS. 3 to 5, the same contents as those of FIGS. 1 and 2 are omitted or simply described. In FIGS. 3 to 5, a Z direction is perpendicular to an X-Y plane.

In the semiconductor device 10-1, a semiconductor layer SL2 may be positioned on a semiconductor substrate SL1. In some embodiments, the semiconductor substrate SL1 may be a silicon substrate. The semiconductor layer SL2 may be a material layer on which element components, for example, a transistor and a capacitor are provided. On the semiconductor layer SL2, the first pattern 20-1, the first assist pattern 40-1, the second pattern 30-1, the first separation layer 50-1, and the second separation layer 52 may be positioned.

As illustrated in FIG. 3, on the semiconductor layer SL2, the second pattern 30-1 is separated from the first pattern 20-1 by the first assist pattern area APL1 including the first assist pattern 40-1. The second pattern 30-1 may include the first sub-pattern 30-1a and the second sub-pattern 30-1b that are spaced apart from each other in the Y direction.

Each of the first sub-pattern 30-1a and the second sub-pattern 30-1b has the third width W3a. The first sub-pattern 30-1a and the second sub-pattern 30-1b may be separated from each other by the second separation layer 52. The first sub-pattern 30-1a and the second sub-pattern 30-1b may be spaced apart from each other by the third distance S3a. A width of the second separation layer 52 may correspond to the third distance S3a.

As illustrated in FIG. 3 and FIG. 5, on the semiconductor layer SL2, the first assist pattern 40-1 may include the first sub-assist pattern 40-1a, the second sub-assist pattern 40-1b, and the third sub-assist pattern 40-1c spaced apart from each other in the Y direction. Each of the first sub-assist pattern 40-1a, the second sub-assist pattern 40-1b, and the third sub-assist pattern 40-1c may have the second width W2a. The second width W2a may be equal to the third width W3a.

The first sub-assist pattern 40-1a, the second sub-assist pattern 40-1b, and the third sub-assist pattern 40-1c may be separated from each other by the first separation layer 50-1, that is, the second sub-separation layer 50-1b. The first sub-assist pattern 40-1a, the second sub-assist pattern 40-1b, and the third sub-assist pattern 40-1c may be spaced apart from each other by the second distance S2a. A width of the first separation layer 50-1 may correspond to the second distance S2a. The first sub-pattern 30-1a and the third sub-assist pattern 40-1c may be spaced apart from each other by the third distance S3a. The second distance S2a may be equal to the third distance S3a.

At one side of the first assist pattern area APL1, the first pattern 20-1, that is, the first portion 20-1a, may be positioned. The first sub-assist pattern 40-1a may be spaced apart from the first pattern 20-1, that is, the first portion 20-1a, by the first distance S1a. By making the first distance S1a greater than the second distance S2a and the third distance S3a, it is possible to prevent the first pattern 20-1 from adhering to the first sub-assist pattern 40-1a.

As illustrated in FIG. 4, on the semiconductor layer SL2, the first assist connection portion APL_CP1 forming the first assist pattern area APL1 may be positioned. The first assist connection portion APL_CP1 may be connected to the first pattern 20-1, that is, the second portion 20-1b.

As described above, the first assist pattern area APL1 of the semiconductor device 10-1 includes the first assist connection portion APL_CP1 connected to the second portion 20-1b of the first pattern 20-1. Therefore, in the semiconductor device 10-1, although the first sub-assist pattern 40-1a or the second sub-assist pattern 40-1b adheres to the first pattern 20-1, the first pattern 20-1 and the second pattern 30-1 may not adhere to each other.

Embodiment 2

Figure 6:
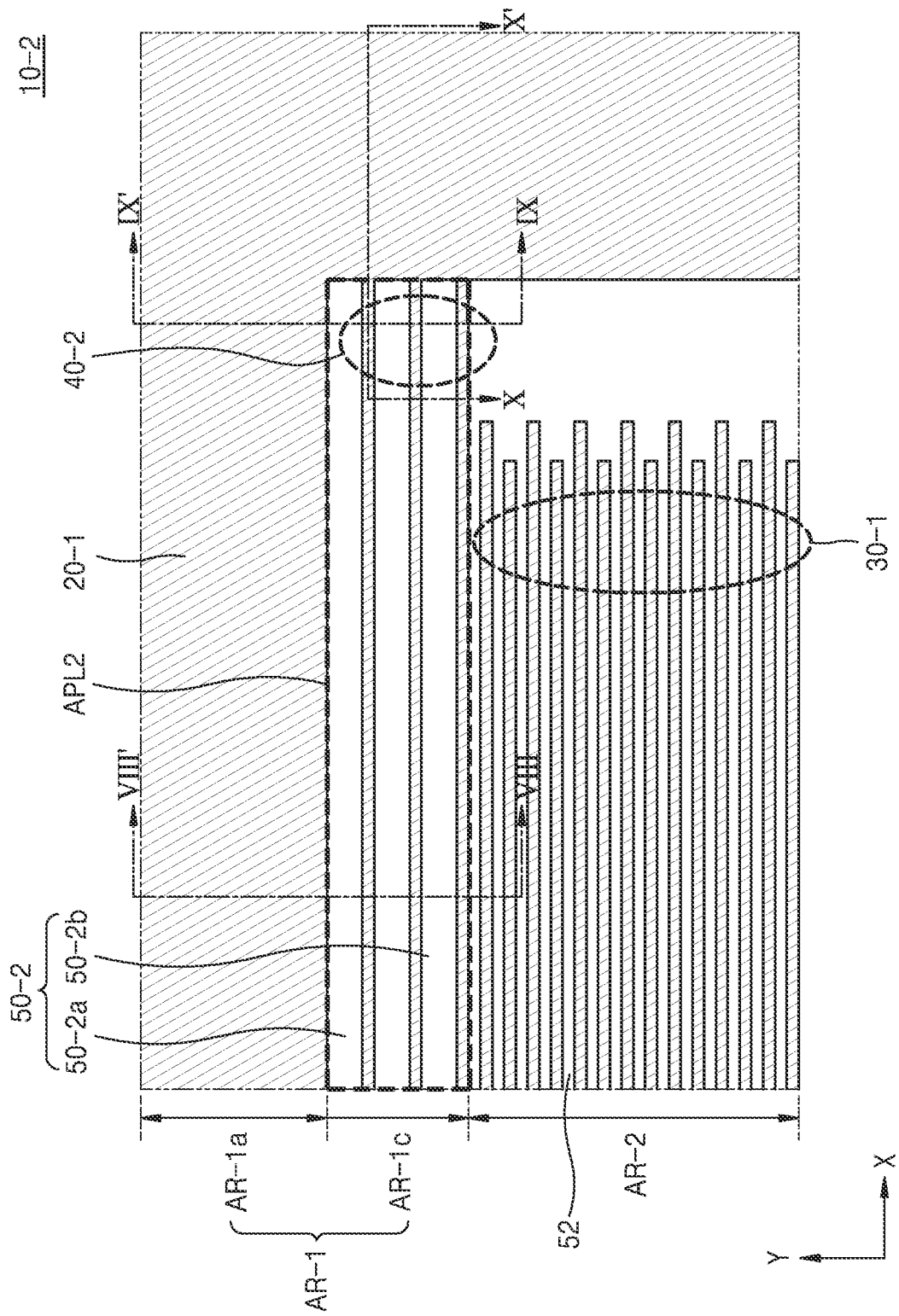
FIGS. 6 and 7 are layout diagrams illustrating a semiconductor device according to some embodiments of the inventive concept.
Figure 7:
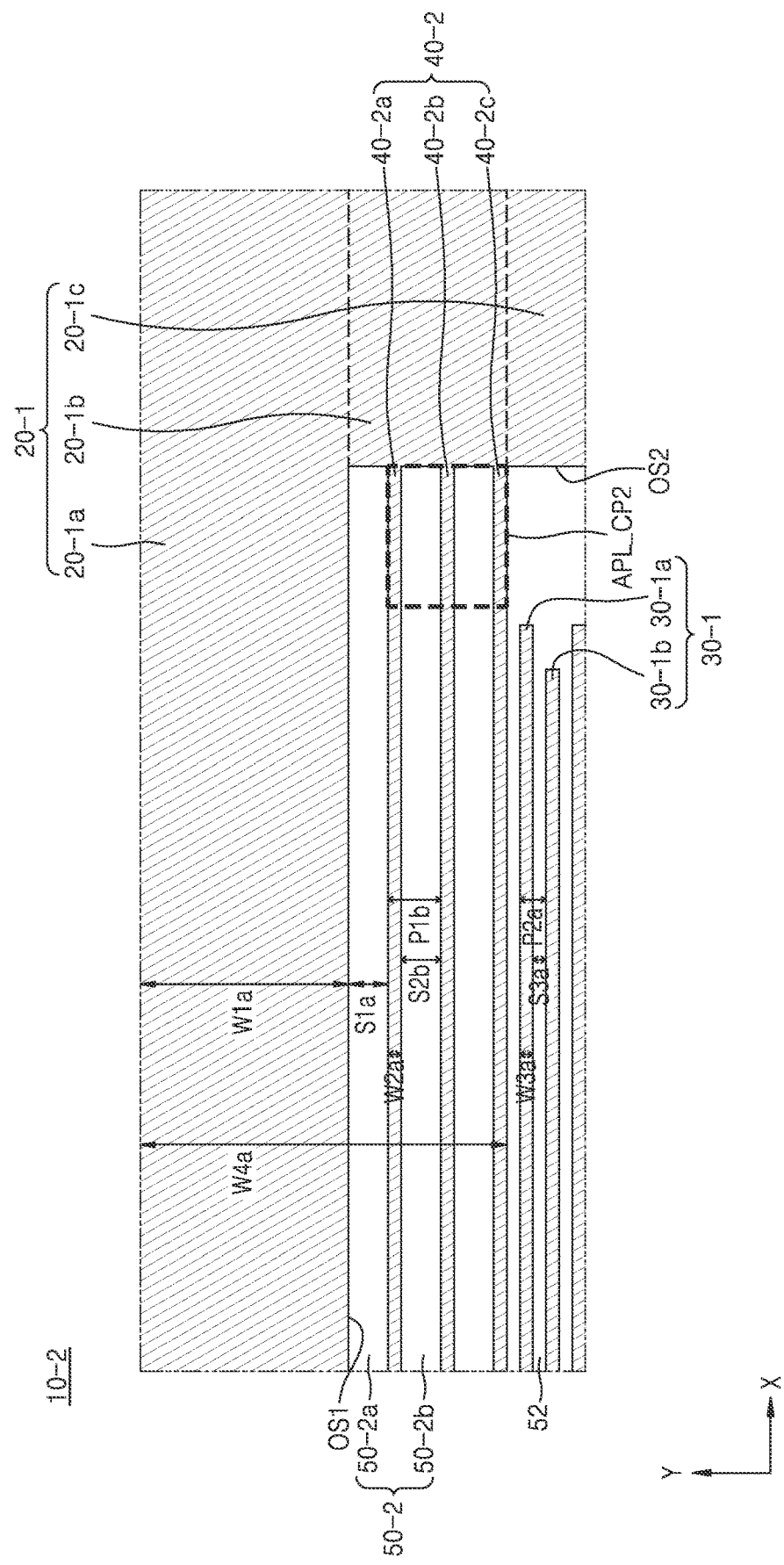

FIGS. 6 and 7 are layout diagrams illustrating a semiconductor device 10-2 according to some embodiments of the inventive concept.

Specifically, FIG. 7 is a view of a partial area of FIG. 6 illustrating the semiconductor device 10-2. The semiconductor device 10-2 of FIGS. 6 and 7 is different from the semiconductor device 10-1 of FIGS. 1 and 2 in a structure of a third sub-pattern area AR-1c forming the first metal wiring pattern area AR-1. In FIGS. 6 and 7, the same reference numerals as those of FIGS. 1 and 2 denote the same elements. In FIGS. 6 and 7, the same contents as those of FIGS. 1 and 2 are omitted or simply described.

The semiconductor device 10-2 may include a first pattern 20-1, a second pattern 30-1, and a second assist pattern 40-2. The second assist pattern 40-2 may correspond to the first assist pattern 40-1 of FIGS. 1 and 2. The second assist pattern 40-2 may be formed of the same material as the first assist pattern 40-1.

The semiconductor device 10-2 may include the first metal wiring pattern area AR-1 including the first pattern 20-1 and the second assist pattern 40-2 and the second metal wiring pattern area AR-2 including the second pattern 30-1. The first metal wiring pattern area AR-1 may include the first sub-pattern area AR-1a including the first pattern 20-1 and the third sub-pattern area AR-1c including the second assist pattern 40-2.

The third sub-pattern area AR-1c may include a second assist pattern area APL2. That is, the second assist pattern area APL2 may be arranged in a part of the first metal wiring pattern area AR-1. The second assist pattern area APL2 may correspond to the first assist pattern area APL1 of FIGS. 1 and 2.

The second assist pattern area APL2 includes the second assist pattern 40-2 connected to the first pattern 20-1. The second assist pattern area APL2 may be arranged in order to control pattern density of the first sub-pattern area AR-1a. The second assist pattern 40-2 may be for suppressing light interference between the second metal wiring pattern area AR-2 and the first sub-pattern area AR-1a during the exposure process.

The second assist pattern 40-2 is arranged in parallel with the second pattern 30-1 and is connected to the first pattern 20-1. The second assist pattern 40-2 may include a second assist connection portion APL_CP2 connected to the first pattern 20-1.

The second assist pattern 40-2 may include first to third sub-assist patterns 40-2a, 40-2b, and 40-2c spaced apart from each other in the form of lines. In FIG. 6, the number of fourth to sixth sub-assist patterns 40-2a, 40-2b, and 40-2c forming the second assist pattern 40-2 is illustrated as 3. However, the inventive concept is not limited thereto.

The fourth to sixth sub-assist patterns 40-2a, 40-2b, and 40-2c may be separated from each other by a third separation layer 50-2. The third separation layer 50-2 may be an insulating layer, for example, an oxide layer or a nitride layer. The third separation layer 50-2 may include a third sub-separation layer 50-2a and a fourth sub-separation layer 50-2b.

The fourth sub-assist pattern 40-2a is close to the first portion 20-1a of the first pattern 20-1. The sixth sub-assist pattern 40-2c is close to the first sub-pattern 30-1a of the second pattern 30-1. The fifth sub-assist pattern 40-2b is positioned between the fourth sub-assist pattern 40-2a and the sixth sub-assist pattern 40-2c in the Y direction.

The third sub-separation layer 50-2a may be positioned between the first portion 20-1a of the first pattern 20-1 and the fourth sub-assist pattern 40-2a. The third sub-separation layer 50-2a may be positioned between the first inner circumference OS1 of the first portion 20-1a of the first pattern 20-1 and the fourth sub-assist pattern 40-2a.

The fourth sub-separation layer 50-2b may be positioned between the fourth sub-assist pattern 40-2a and the fifth sub-assist pattern 40-2b and/or between the fifth sub-assist pattern 40-2b and the sixth sub-assist pattern 40-2c. The fourth to sixth sub-assist patterns 40-2a, 40-2b, and 40-2c may be arranged in parallel with the first and second sub-patterns 30-1a and 30-1b of the second pattern 30-1 in the form of lines. The fourth to sixth sub-assist patterns 40-2a, 40-2b, and 40-2c may be connected to the second portion 20-1b of the first pattern 20-1.

The first portion 20-1a of the first pattern 20-1 may be apart from the fourth sub-assist pattern 40-2a by the first distance S1a. Each of the fourth to sixth sub-assist patterns 40-2a, 40-2b, and 40-2c may have the second width W2a in the Y direction. The first portion 20-1a of the first pattern 20-1 and the second assist pattern 40-2 collectively may have the fourth width W4a in the Y direction. The fourth to sixth sub-assist patterns 40-2a, 40-2b, and 40-2c may be spaced apart from each other by a fourth distance S2b.

That is, the fourth sub-assist pattern 40-2a and the fifth sub-assist pattern 40-2b may be spaced apart from each other by the fourth distance S2b and the fifth sub-assist pattern 40-2b and the sixth sub-assist pattern 40-2c may be spaced apart from each other by the fourth distance S2b. In the fourth to sixth sub-assist patterns 40-2a, 40-2b, and 40-2c, the second width W2a may be a minimum feature size. The fourth to sixth sub-assist patterns 40-2a, 40-2b, and 40-2c may be arranged in the second direction at a third pitch P1b.

The first and second sub-patterns 30-1a and 30-1b may be arranged in the second direction at the second pitch P2a. In some embodiments, the first width W1a may be greater than the second width W2a of the second assist pattern 40-2 and/or the third width W3a of the second pattern 30-1 in the Y direction. The first width W1a of the first pattern 20-1, for example, the first portion 20-1a may be greater than the second width W2a of the second assist pattern 40-2 and/or the third width W3a of the second pattern 30-1 in the Y direction, and may be referred to as the wide pattern.

The second assist pattern 40-2 and the second pattern 30-1 may be in the form of lines extending in the X direction. The second width W2a of the second assist pattern 40-2 and/or the third width W3a of the second pattern 30-1 may be less than the first width W1a of the first pattern 20-1, for example, the first portion 20-1a and may be referred to as the narrow pattern.

In some embodiments, the first distance S1a may be equal to the fourth distance S2b. In some embodiments, the fourth distance S2b may be 0.3 µm to 0.6 µm. The first distance S1a and the fourth distance S2b may be greater than the third distance S3a. The third pitch P1b may be greater than the second pitch P2a.

In some embodiments, the first width W1a of the first pattern 20-1, for example, the first portion 20-1a may be no less than 100 times a minimum feature size of the second assist pattern 40-2 and/or the second pattern 30-1 in the Y direction, for example, one of the second width W2a, the third width W3a, and the third distance S3a.

In some embodiments, the fourth width W4a including the first portion 20-1a of the first pattern 20-1 and the second assist pattern 40-2 may be no less than 100 times the minimum feature size of the second assist pattern 40-2 and/or the second pattern 30-1 in the Y direction, for example, one of the second width W2a, the third width W3a, and the third distance S3a.

The semiconductor device 10-2 having the above layout includes the third sub-pattern area AR-1c including the second assist pattern 40-2 and connects the second assist pattern 40-2 to the first pattern 20-1. In the semiconductor device 10-2, although the fourth and fifth sub-assist patterns 40-2a and 40-2b adhere to the first pattern 20-1, the first pattern 20-1 does not adhere to the second pattern 30-1.

Figure 8:
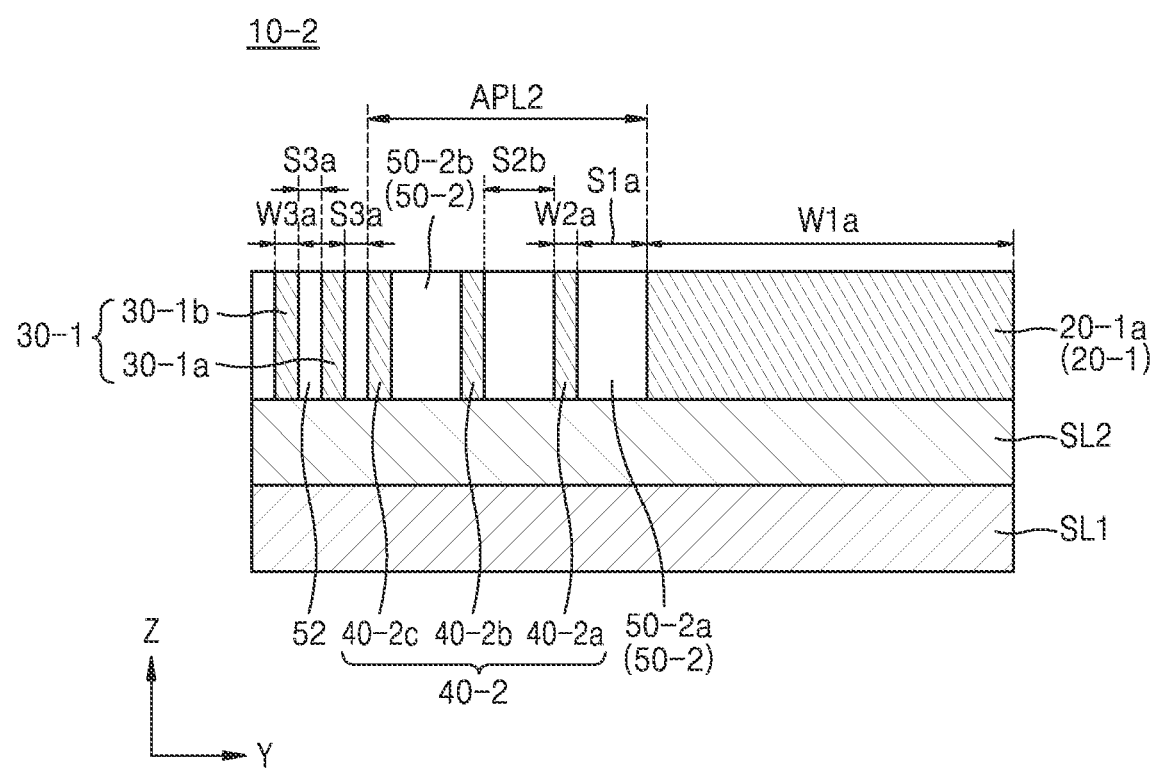
FIGS. 8 to 10 are cross-sectional views each illustrating a main portion of a semiconductor device respectively taken along lines VIII-VIII', IX-IX', and X-X' of FIG. 6.
Figure 9:
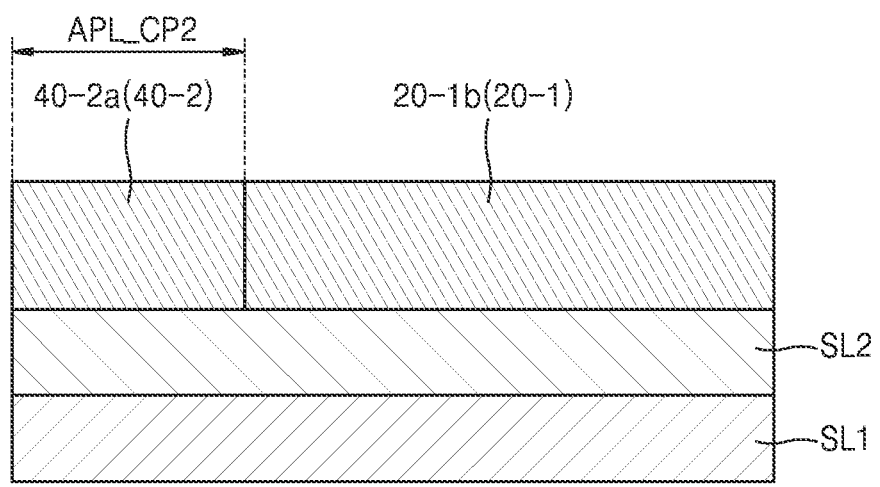
Figure 10:
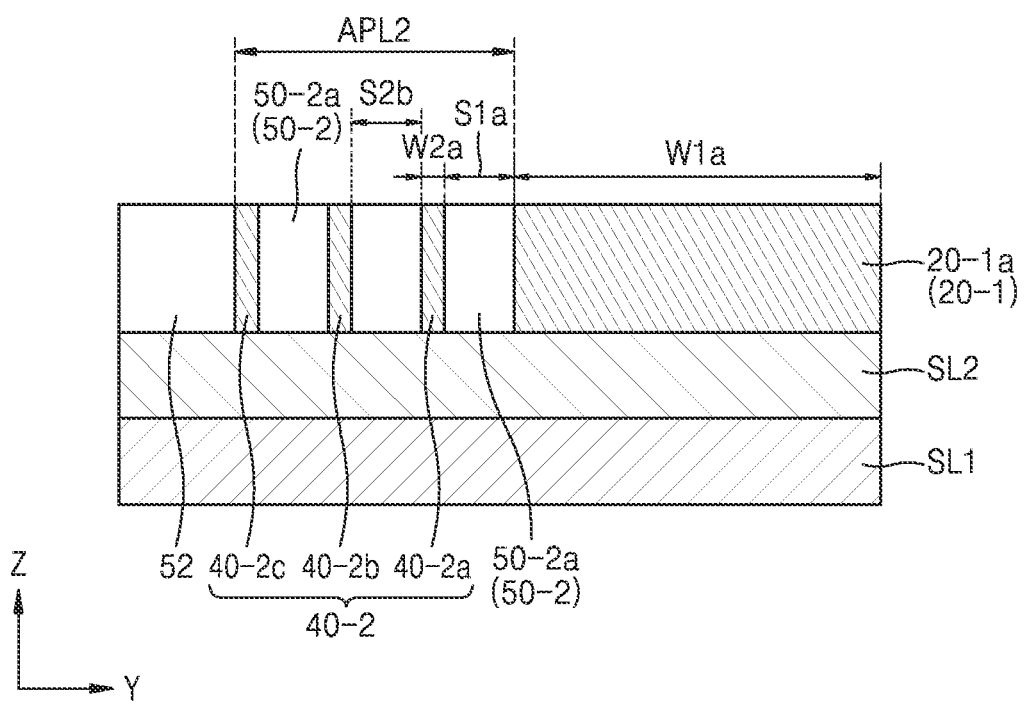

FIGS. 8 to 10 are cross-sectional views each illustrating a main portion of the semiconductor device 10-2 taken along each of the lines VIII-VIII', IX-IX', and X-X' of FIG. 6.

Specifically, in FIGS. 8 to 10, the same reference numerals as those of FIGS. 6 and 7 denote the same elements. In FIGS. 8 to 10, the same contents as those of FIGS. 6 and 7 are omitted or simply described. In FIGS. 8 to 10, a Z direction is perpendicular to an X-Y plane.

In the semiconductor device 10-2, the semiconductor layer SL2 may be positioned on the semiconductor substrate SL1. On the semiconductor layer SL2, the first pattern 20-1, the second assist pattern 40-2, the second pattern 30-1, the second separation layer 52, and the third separation layer 50-2 may be positioned.

As illustrated in FIG. 8, on the semiconductor layer SL2, the second pattern 30-1 is separated from the first pattern 20-1 by the second assist pattern area APL2 including the second assist pattern 40-2. The second pattern 30-1 may include the first sub-pattern 30-1a and the second sub-pattern 30-1b. The first sub-pattern 30-1a and the second sub-pattern 30-1b are separate by the second separation layer 52 and each of the first sub-pattern 30-1a and the second sub-pattern 30-1b has the third width W3a. The first sub-pattern 30-1a and the second sub-pattern 30-1b may be spaced apart from each other by the third distance S3a.

As illustrated in FIG. 8 and FIG. 10, on the semiconductor layer SL2, the second assist pattern 40-2 may include the fourth sub-assist pattern 40-2a, the fifth sub-assist pattern 40-2b, and the sixth sub-assist pattern 40-2c spaced apart from each other in the Y direction. Each of the fourth sub-assist pattern 40-2a, the fifth sub-assist pattern 40-2b, and the sixth sub-assist pattern 40-2c may have the second width W2a. The second width W2a may be equal to the third width W3a.

The fourth sub-assist pattern 40-2a, the fifth sub-assist pattern 40-2b, and the sixth sub-assist pattern 40-2c may be separate by the third separation layer 50-2, that is, the fourth sub-separation layer 50-2b. The fourth sub-assist pattern 40-2a, the fifth sub-assist pattern 40-2b, and the sixth sub-assist pattern 40-2c may be spaced apart from each other by the fourth distance S2b. A width of the third separation layer 50-2 may correspond to the fourth distance S2b. The first sub-pattern 30-1a and the sixth sub-assist pattern 40-2c may be spaced apart from each other by the third distance S3a.

The first pattern 20-1, that is, the first portion 20-1a may be positioned at one side of the second assist pattern area APL2. The fourth sub-assist pattern 40-2a may be spaced apart from the first pattern 20-1, that is, the first portion 20-1a by the first distance S1a. By making the first distance S1a greater than the third distance S3a, it is possible to prevent the first pattern 20-1 from adhering to the fourth sub-assist pattern 40-2a.

As illustrated in FIG. 9, on the semiconductor layer SL2, the second assist connection portion APL CP2 forming the second assist pattern area APL2 may be positioned. The second assist connection portion APL CP2 may be connected to the first pattern 20-1, that is, the second portion 20-1b. In the semiconductor device 10-2, although the fourth and fifth sub-assist patterns 40-2a and 40-2b adhere to the first pattern 20-1, the first pattern 20-1 and the second pattern 30-1 may not adhere to each other.

Embodiment 3

Figure 11:
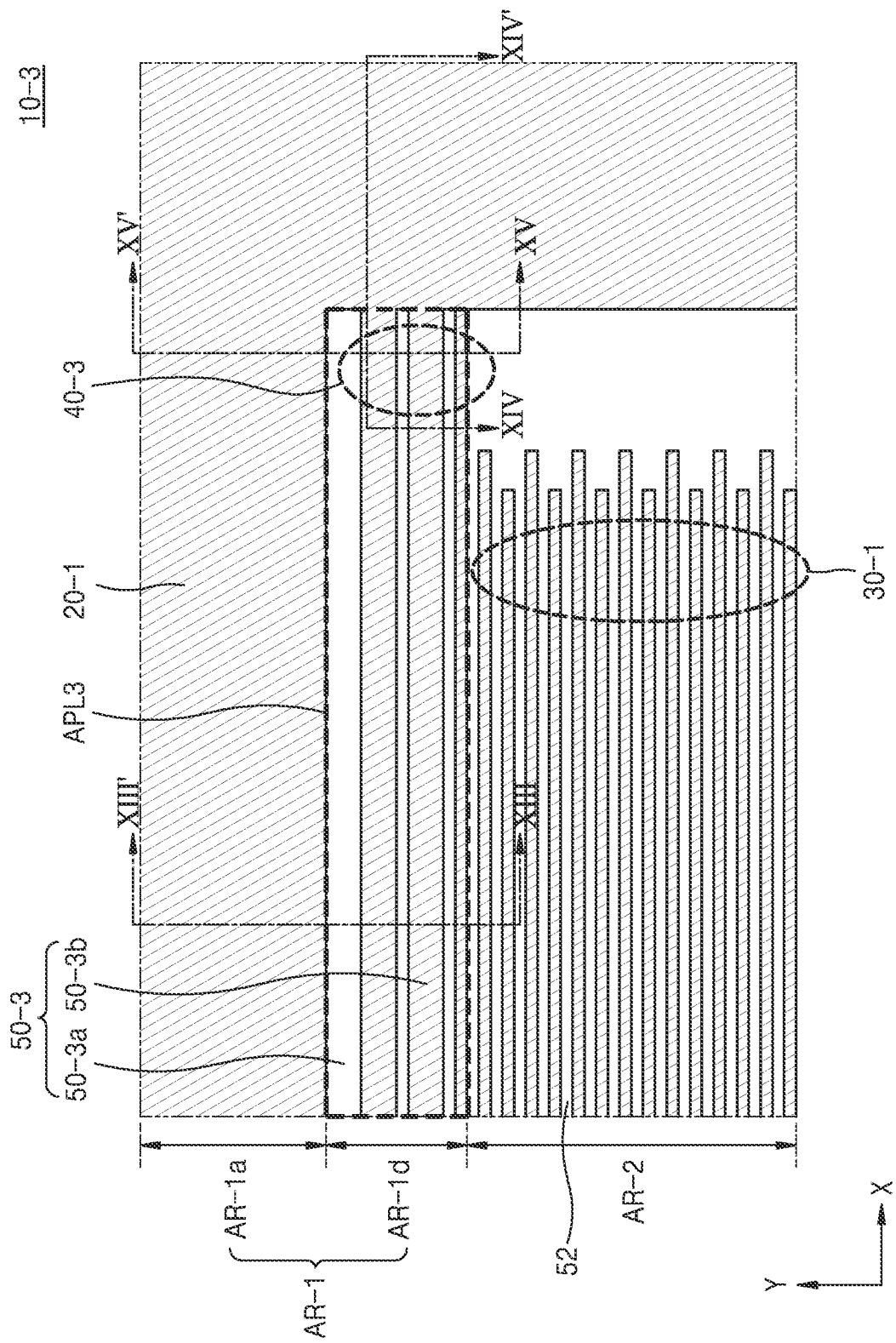
FIGS. 11 and 12 are layout diagrams illustrating a semiconductor device according to some embodiments of the inventive concept.
Figure 12:
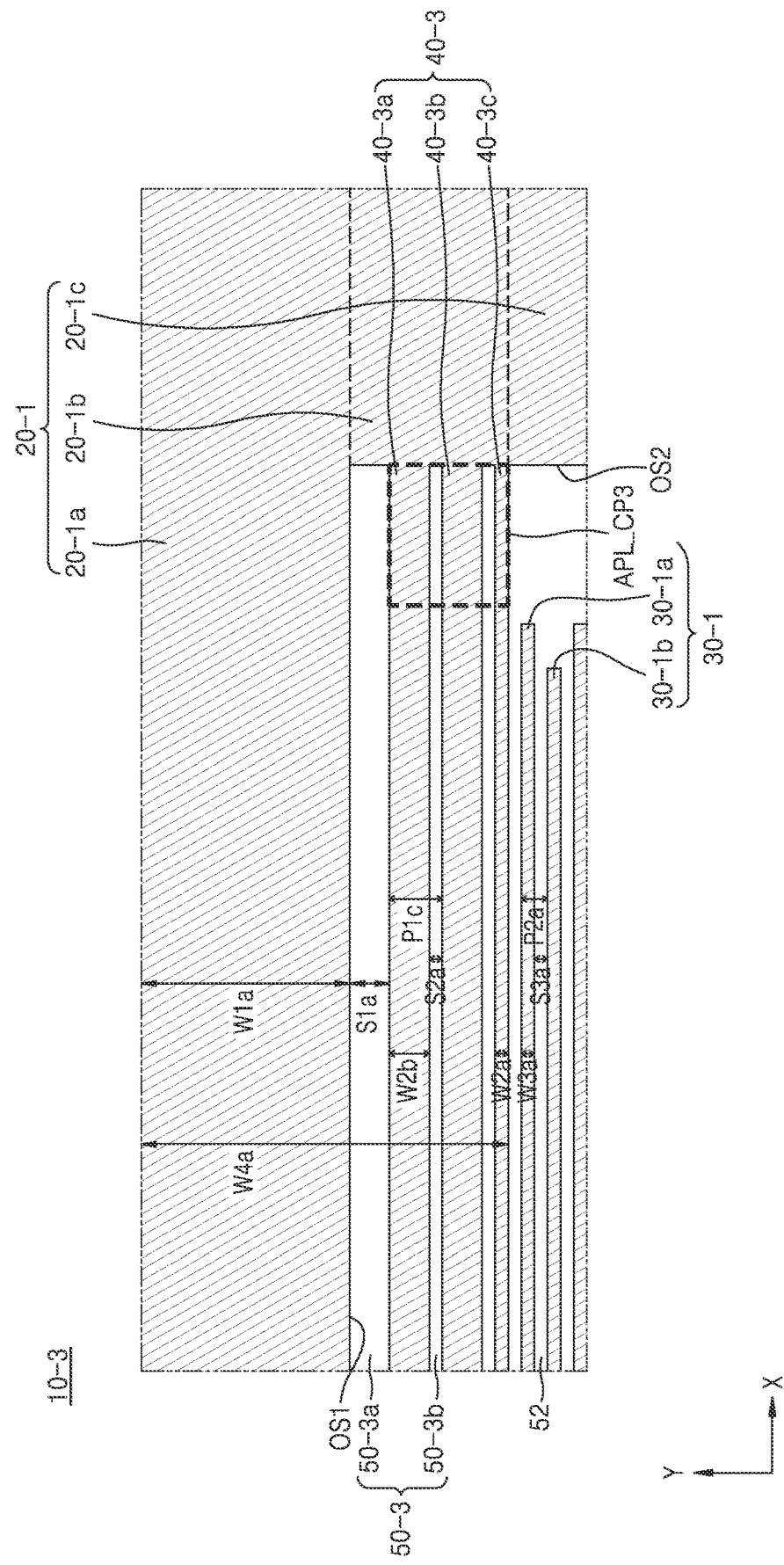

FIGS. 11 and 12 are layout diagrams illustrating a semiconductor device 10-3 according to some embodiments of the inventive concept Specifically, FIG. 12 is a view of a partial area of FIG. 11 illustrating the semiconductor device 10-3. The semiconductor device 10-3 of FIGS. 11 and 12 is different from the semiconductor device 10-1 of FIGS. 1 and 2 in a structure of a fourth sub-pattern area AR-1d forming the first metal wiring pattern area AR-1. In FIGS. 11 and 12, the same reference numerals as those of FIGS. 1 and 2 denote the same elements. In FIGS. 11 and 12, the same contents as those of FIGS. 1 and 2 are omitted or simply described.

The semiconductor device 10-3 may include a first pattern 20-1, a second pattern 30-1, and a third assist pattern 40-3. The third assist pattern 40-3 may correspond to the first assist pattern 40-1 of FIGS. 1 and 2. The third assist pattern 40-3 may be formed of the same material as the first assist pattern 40-1.

The semiconductor device 10-3 may include the first metal wiring pattern area AR-1 including the first pattern 20-1 and the third assist pattern 40-3 and the second metal wiring pattern area AR-2 including the second pattern 30-1. The first metal wiring pattern area AR-1 may include the first sub-pattern area AR-1a including the first pattern 20-1 and the fourth sub-pattern area AR-1d including the third assist pattern 40-3.

The fourth sub-pattern area AR-1d may include a third assist pattern area APL3. That is, the third assist pattern area APL3 may be arranged in a part of the first metal wiring pattern area AR-1. The third assist pattern area APL3 may correspond to the first assist pattern area APL1 of FIGS. 1 and 2.

The third assist pattern area APL3 includes the third assist pattern 40-3 connected to the first pattern 20-1. The third assist pattern area APL3 may be arranged in order to control the pattern density of the first sub-pattern area AR-1a. The third assist pattern 40-3 may be used for suppressing light interference between the second metal wiring pattern area AR-2 and the first sub-pattern area AR-1a during the exposure process.

The third assist pattern 40-3 is arranged in parallel with the second pattern 30-1 and is connected to the first pattern 20-1. The third assist pattern 40-3 may include a third assist connection portion APL_CP3 connected to the first pattern 20-1.

The third assist pattern 40-3 may include seventh to ninth sub-assist patterns 40-3a, 40-3b, and 40-3c spaced apart from each other in the form of lines. In FIG. 11, the number of seventh to ninth sub-assist patterns 40-3a, 40-3b, and 40-3c forming the third assist pattern 40-2 is illustrated as 3. However, the inventive concept is not limited thereto.

The seventh to ninth sub-assist patterns 40-3a, 40-3b, and 40-3c may be separated from each other by a fourth separation layer 50-3. The fourth separation layer 50-3 may be an insulating layer, for example, an oxide layer or a nitride layer. The fourth separation layer 50-3 may include a fifth sub-separation layer 50-3a and a sixth sub-separation layer 50-3b.

The seventh sub-assist pattern 40-3a is close to the first portion 20-1a of the first pattern 20-1. The ninth sub-assist pattern 40-3c is close to the first sub-pattern 30-1a of the second pattern 30-1. The eighth sub-assist pattern 40-3b is positioned between the seventh sub-assist pattern 40-3a and the ninth sub-assist pattern 40-3c in the Y direction.

The fifth sub-separation layer 50-3a may be positioned between the first portion 20-1a of the first pattern 20-1 and the seventh sub-assist pattern 40-3a. The fifth sub-separation layer 50-3a may be positioned between the first inner circumference OS1 of the first portion 20-1a of the first pattern 20-1 and the seventh sub-assist pattern 40-3a.

The sixth sub-separation layer 50-3b may be positioned between the seventh sub-assist pattern 40-3a and the eighth sub-assist pattern 40-3b and between the eighth sub-assist pattern 40-3b and the ninth sub-assist pattern 40-3c. The seventh to ninth sub-assist patterns 40-3a, 40-3b, and 40-3c may be arranged in parallel with the first and second sub-patterns 30-1a and 30-1b of the second pattern 30-1 in the form of lines. The seventh to ninth sub-assist patterns 40-3a, 40-3b, and 40-3c may be connected to the second portion 20-1b of the first pattern 20-1.

The first portion 20-1a of the first pattern 20-1 may be apart from the seventh sub-assist pattern 40-3a by the first distance S1a. Each of the seventh and eighth sub-assist patterns 40-3a and 40-3b may have a fifth width W2b in the Y direction. The fifth width W2b may be equal to the first distance S1a. In some embodiments, the fifth width W2b may be 0.3 μm to 0.6 μm. The ninth sub-assist pattern 40-3c may have the second width W2a in the Y direction.

Each of the seventh and eighth sub-assist patterns 40-3a and 40-3b may have a width different from that of the ninth sub-assist pattern 40-3c. In some embodiments, each of the seventh and eighth sub-assist patterns 40-3a and 40-3b has a width different from that of the ninth sub-assist pattern 40-3c. However, the widths of the seventh to ninth sub-assist patterns 40-3a, 40-3b, and 40-3c may be different from each other.

The first portion 20-1a of the first pattern 20-1 and the third assist pattern 40-3 collectively may have the fourth width W4a in the Y direction. The seventh to ninth sub-assist patterns 40-3a, 40-3b, and 40-3c may be spaced apart from each other by the second distance S2a.

That is, the seventh sub-assist pattern 40-3a and the eighth sub-assist pattern 40-3b may be spaced apart from each other by the second distance S2a and the eighth sub-assist pattern 40-3b and the ninth sub-assist pattern 40-3c may be spaced apart from each other by the second distance S2a. In the ninth sub-assist pattern 40-3c, the second width W2a may be a minimum feature size. The seventh and eighth sub-assist patterns 40-3a and 40-3b may be arranged in the second direction at a fourth pitch P1c. The first and second sub-patterns 30-1a and 30-1b may be arranged in the second direction at the second pitch P2a.

In some embodiments, the first width W1a may be greater than the second width W2a and the fifth width W2b of the third assist pattern 40-3 and/or the third width W3a of the second pattern 30-1 in the Y direction. In some embodiments, the first distance S1a may be greater than the second distance S2a and the third distance S3a. The fourth pitch P1c may be greater than the second pitch P2a.

In some embodiments, the first width W1a of the first pattern 20-1, for example, the first portion 20-1a, may be no less than 100 times a minimum feature size of the ninth sub-assist pattern 40-3c and/or the second pattern 30-1 in the Y direction, for example, one of the second width W2a, the third width W3a, and the third distance S3a.

In some embodiments, the fourth width W4a including the first portion 20-1a of the first pattern 20-1 and the third assist pattern 40-3 may be no less than 100 times the minimum feature size of the ninth sub-assist pattern 40-3c and/or the second pattern 30-1 in the Y direction, for example, one of the second width W2a, the third width W3a, and the third distance S3a.

The semiconductor device 10-3 having the above layout includes the fourth sub-pattern area AR-1d including the third assist pattern 40-3 and connects the third assist pattern 40-3 to the first pattern 20-1. In the semiconductor device 10-3, although the seventh and eighth sub-assist patterns 40-3a and 40-3b adhere to the first pattern 20-1, the first pattern 20-1 does not adhere to the second pattern 30-1.

Figure 13:
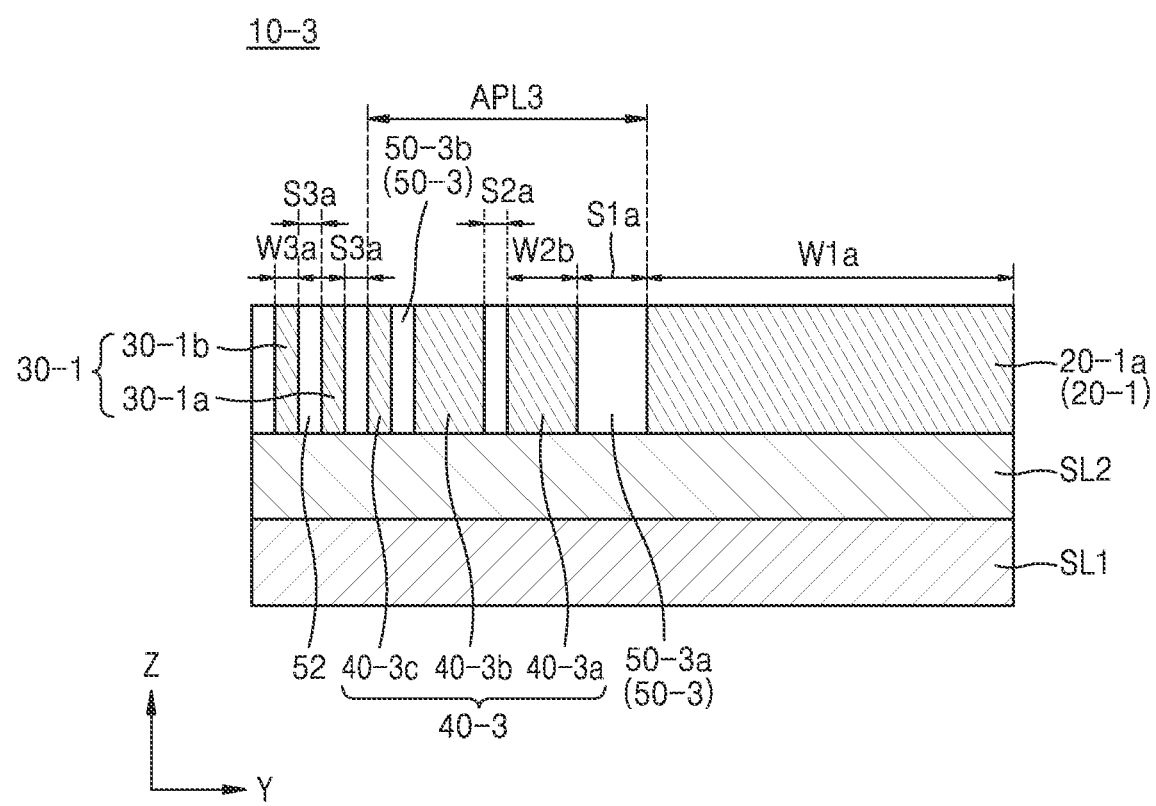
FIGS. 13 to 15 are cross-sectional views each illustrating a main portion of a semiconductor device respectively taken along lines XIII-XIII', XIV-XIV', and XV-XV' of FIG. 11.
Figure 14:
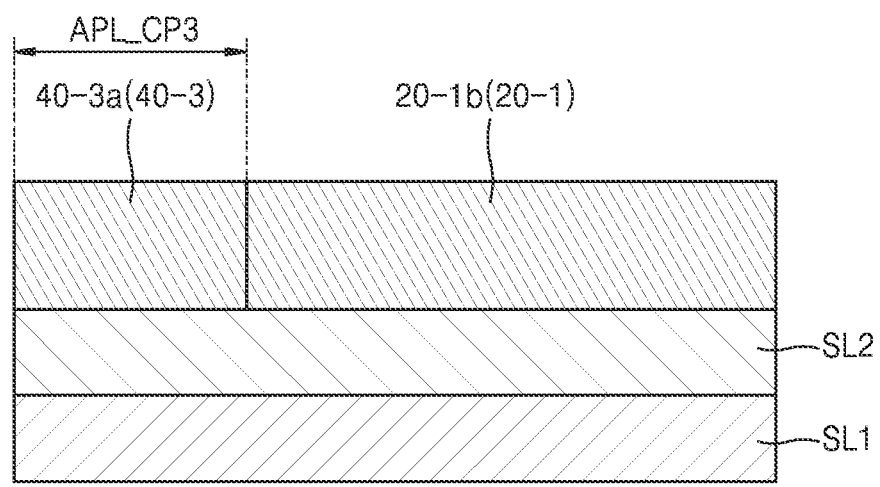
Figure 15:
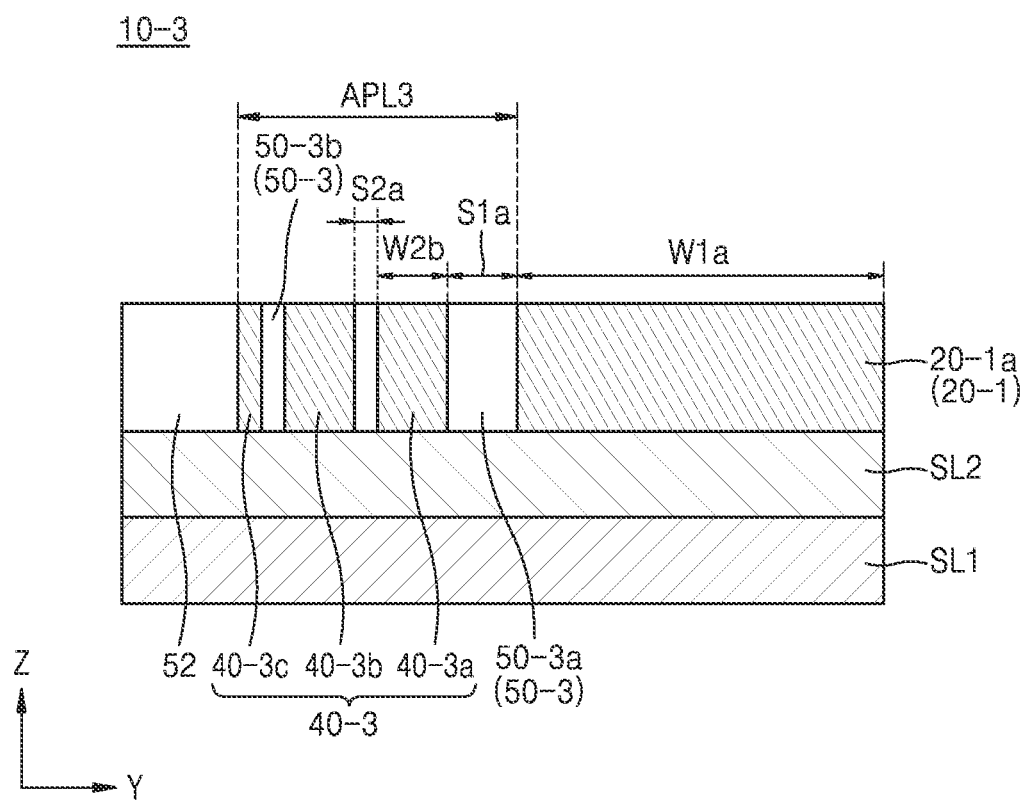

FIGS. 13 to 15 are cross-sectional views each illustrating a main portion of the semiconductor device 10-3 taken along each of the lines XIII-XIII', XIV-XIV', and XV-XV' of FIG. 11.

Specifically, in FIGS. 13 to 15, the same reference numerals as those of FIGS. 11 and 12 denote the same elements. In FIGS. 13 to 15, the same contents as those of FIGS. 11 and 12 are omitted or simply described. In FIGS. 13 to 15, a Z direction is perpendicular to an X-Y plane.

In the semiconductor device 10-3, the semiconductor layer SL2 may be positioned on the semiconductor substrate SL1. On the semiconductor layer SL2, the first pattern 20-1, the third assist pattern 40-3, the second pattern 30-1, the second separation layer 52, and the fourth separation layer 50-3 may be positioned.

As illustrated in FIG. 13, on the semiconductor layer SL2, the second pattern 30-1 is separated from the first pattern 20-1 by the third assist pattern area APL3 including the third assist pattern 40-3. The second pattern 30-1 may include the first sub-pattern 30-1a and the second sub-pattern 30-1b. The first sub-pattern 30-1a and the second sub-pattern 30-1b are separated by the second separation layer 52 and each of the first sub-pattern 30-1a and the second sub-pattern 30-1b has the third width W3a. The first sub-pattern 30-1a and the second sub-pattern 30-1b may be spaced apart from each other by the third distance S3a.

As illustrated in FIGS. 13 and 15, on the semiconductor layer SL2, the third assist pattern 40-3 may include the seventh sub-assist pattern 40-3a, the eighth sub-assist pattern 40-3b, and the ninth sub-assist pattern 40-3c spaced apart from each other in the Y direction. Each of the seventh sub-assist pattern 40-3a, the eighth sub-assist pattern 40-3b, and the ninth sub-assist pattern 40-3c may have the fifth width W2b. The fifth width W2b may be greater than the third width W3a.

The seventh sub-assist pattern 40-3a, the eighth sub-assist pattern 40-3b, and the ninth sub-assist pattern 40-3c may be separated from each other by the fourth separation layer 50-3, that is, the sixth sub-separation layer 50-3b. The seventh sub-assist pattern 40-3a, the eighth sub-assist pattern 40-3b, and the ninth sub-assist pattern 40-3c may be spaced apart from each other by the second distance S2a. A width of the fourth separation layer 50-3 may correspond to the second distance S2a. The first sub-pattern 30-1a and the ninth sub-assist pattern 40-3c may be spaced apart from each other by the third distance S3a.

The first pattern 20-1, that is, the first portion 20-1a may be positioned at one side of the third assist pattern area APL3. The seventh sub-assist pattern 40-3a may be apart from the first pattern 20-1, that is, the first portion 20-1a by the first distance S1a. By making the first distance S1a greater than the second distance S2a or the third distance S3a, it is possible to prevent the first pattern 20-1 from adhering to the seventh sub-assist pattern 40-3a.

As illustrated in FIG. 14, on the semiconductor layer SL2, the third assist connection portion APL_CP3 forming the third assist pattern area APL3 may be positioned. The third assist connection portion APL_CP3 may be connected to the first pattern 20-1, that is, the second portion 20-1b. In the semiconductor device 10-3, although the seventh and eighth sub-assist patterns 40-3a and 40-3b adhere to the first pattern 20-1, the first pattern 20-1 and the second pattern 30-1 may not adhere to each other.

Embodiment 4

Figure 16:
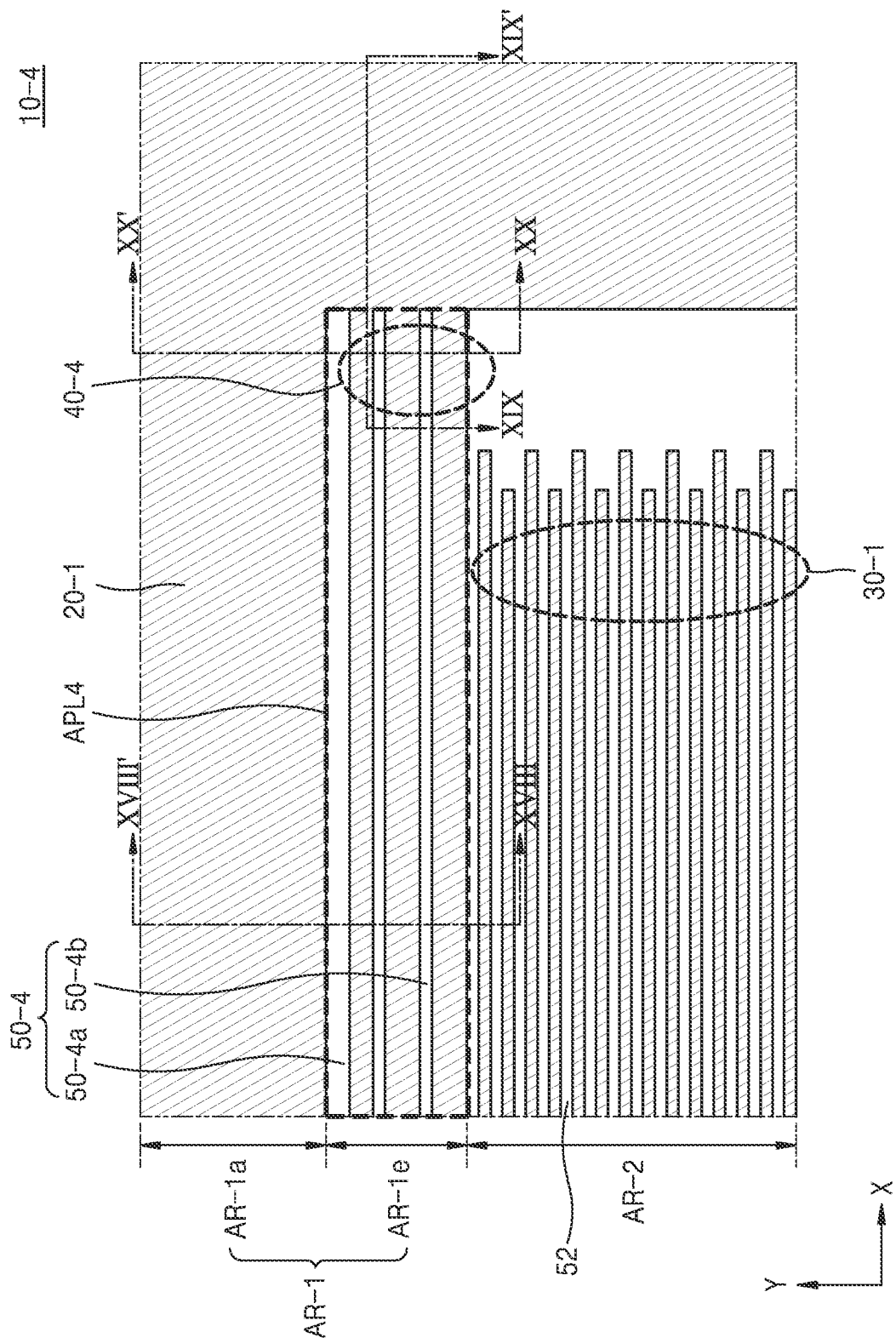
FIGS. 16 and 17 are layout diagrams illustrating a semiconductor device according to some embodiments of the inventive concept.
Figure 17:
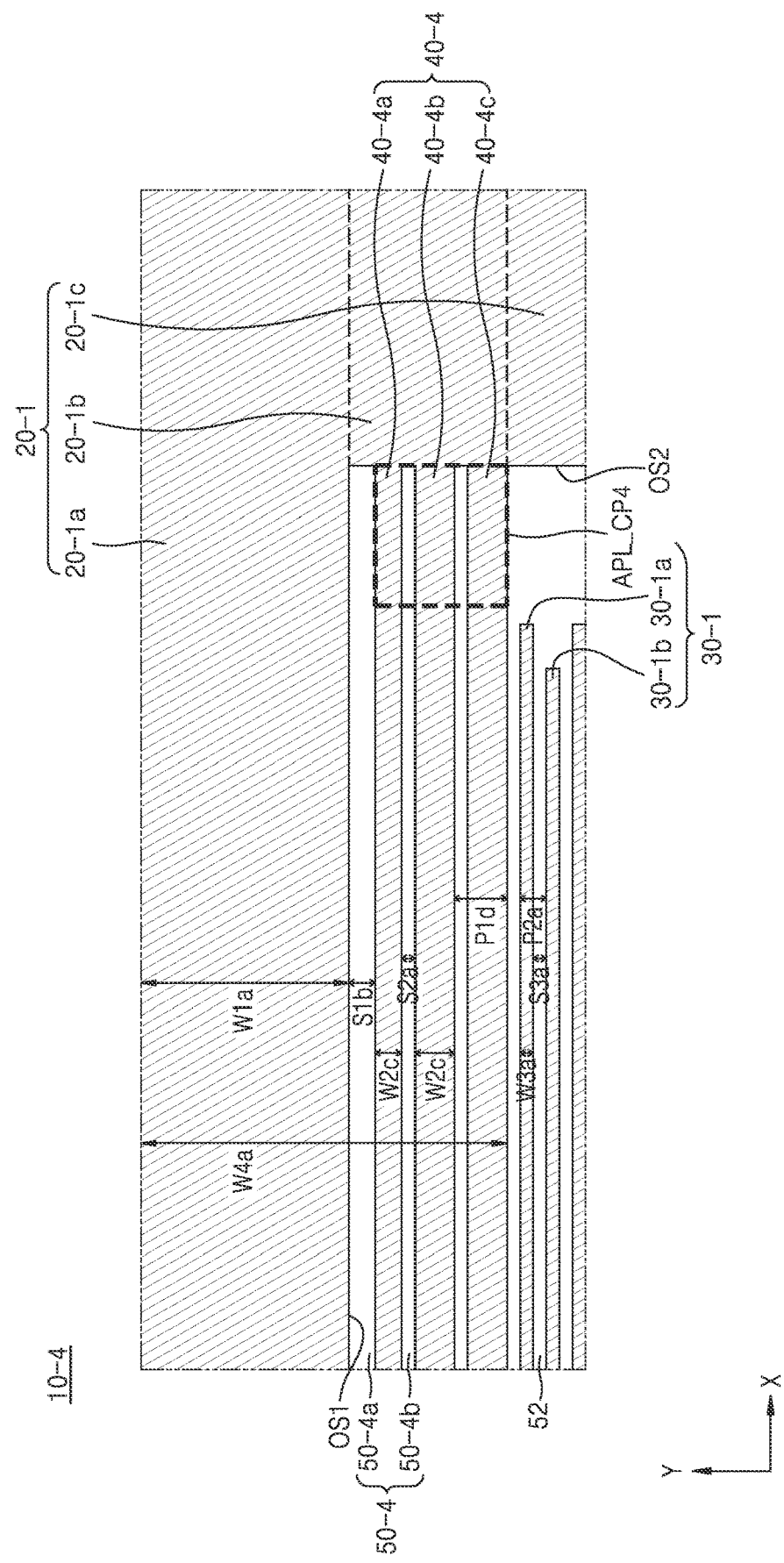

FIGS. 16 and 17 are layout diagrams illustrating a semiconductor device 10-4 according to some embodiments of the inventive concept.

Specifically, FIG. 17 is a view of a partial area of FIG. 16 illustrating the semiconductor device 10-4. The semiconductor device 10-4 of FIGS. 16 and 17 is different from the semiconductor device 10-1 of FIGS. 1 and 2 in a structure of a fifth sub-pattern area AR-1e forming the first metal wiring pattern area AR-1. In FIGS. 16 and 17, the same reference numerals as those of FIGS. 1 and 2 denote the same elements. In FIGS. 16 and 17, the same contents as those of FIGS. 1 and 2 are omitted or simply described.

The semiconductor device 10-4 may include a first pattern 20-1, a second pattern 30-1, and a fourth assist pattern 40-4. The fourth assist pattern 40-4 may correspond to the first assist pattern 40-1 of FIGS. 1 and 2. The fourth assist pattern 40-4 may be formed of the same material as the first assist pattern 40-1.

The semiconductor device 10-4 may include the first metal wiring pattern area AR-1 including the first pattern 20-1 and the fourth assist pattern 40-4 and the second metal wiring pattern area AR-2 including the second pattern 30-1. The first metal wiring pattern area AR-1 may include the first sub-pattern area AR-1a including the first pattern 20-1 and the fifth sub-pattern area AR-1e including the fourth assist pattern 40-4.

The fifth sub-pattern area AR-1e may include a fourth assist pattern area APL4. That is, the fourth assist pattern area APL4 may be arranged in a part of the first metal wiring pattern area AR-1. The fourth assist pattern area APL4 may correspond to the first assist pattern area APL1 of FIGS. 1 and 2.

The fourth assist pattern area APL4 includes the fourth assist pattern 40-4 connected to the first pattern 20-1. The fourth assist pattern area APL4 may be arranged in order to control the pattern density of the first sub-pattern area AR-1a. The fourth assist pattern 40-4 may be for suppressing light interference between the second metal wiring pattern area AR-2 and the first sub-pattern area AR-1a during the exposure process.

The fourth assist pattern 40-4 is arranged in parallel with the second pattern 30-1 and is connected to the first pattern 20-1. The fourth assist pattern 40-4 may include a fourth assist connection portion APL_CP4 connected to the first pattern 20-1.

The fourth assist pattern 40-4 may include tenth to twelfth sub-assist patterns 40-4a, 40-4b, and 40-4c spaced apart from each other in the form of lines. In FIG. 16, the number of tenth to twelfth sub-assist patterns 40-4a, 40-4b, and 40-4c forming the fourth assist pattern 40-4 is illustrated as 3. However, the inventive concept is not limited thereto.

The tenth to twelfth sub-assist patterns 40-4a, 40-4b, and 40-4c may be separated from each other by a fifth separation layer 50-4. The fifth separation layer 50-4 may be an insulating layer, for example, an oxide layer or a nitride layer. The fifth separation layer 50-4 may include a seventh sub-separation layer 50-43a and an eighth sub-separation layer 50-4b.

The tenth sub-assist pattern 40-4a is close to the first portion 20-1a of the first pattern 20-1. The twelfth sub-assist pattern 40-4c is close to the first sub-pattern 30-1a of the second pattern 30-1. The eleventh sub-assist pattern 40-4b is positioned between the tenth sub-assist pattern 40-4a and the twelfth sub-assist pattern 40-4c in the Y direction.

The seventh sub-separation layer 50-4a may be positioned between the first portion 20-1a of the first pattern 20-1 and the tenth sub-assist pattern 40-4a. The seventh sub-separation layer 50-4a may be positioned between the first inner circumference OS1 of the first portion 20-1a of the first pattern 20-1 and the tenth sub-assist pattern 40-4a.

The eighth sub-separation layer 50-4b may be positioned between the tenth sub-assist pattern 40-4a and the eleventh sub-assist pattern 40-4b, and between the eleventh sub-assist pattern 40-4b and the twelfth sub-assist pattern 40-4c. The tenth to twelfth sub-assist patterns 40-4a, 40-4b, and 40-4c may be arranged in parallel with the first and second sub-patterns 30-1a and 30-1b of the second pattern 30-1 in the form of lines. The tenth to twelfth sub-assist patterns 40-4a, 40-4b, and 40-4c may be connected to the second portion 20-1b of the first pattern 20-1.

The first portion 20-1a of the first pattern 20-1 may be spaced apart from the tenth sub-assist pattern 40-4a by a fifth distance S1b. Each of the eleventh and twelfth sub-assist patterns 40-4b and 40-4c may have the fifth width W2b in the Y direction. The tenth sub-assist pattern 40-4a may have a sixth width W2c in the Y direction.

Each of the eleventh and twelfth sub-assist patterns 40-4b and 40-4c may have a width different from that of the tenth sub-assist pattern 40-4a. In some embodiments, the sixth width W2c may be less than the fifth width W2b. The fifth distance S1b may be equal to the sixth width W2c. In some embodiments, the fifth distance S1b and the sixth width W2c may be 0.3 μm to 0.4 μm.

In some embodiments, each of the eleventh and twelfth sub-assist patterns 40-4b and 40-4c has a width different from that of the tenth sub-assist pattern 40-4a. However, the widths of the tenth to twelfth sub-assist patterns 40-4a, 40-4b, and 40-4c may be different from each other.

The first portion 20-1a of the first pattern 20-1 and the fourth assist pattern 40-4 collectively may have the fourth width W4a in the Y direction. The tenth to twelfth sub-assist patterns 40-4a, 40-4b, and 40-4c may be spaced apart from each other by the second distance S2a.

That is, the tenth sub-assist pattern 40-4a and the eleventh sub-assist pattern 40-4b may be spaced apart from each other by the second distance S2a and the eleventh sub-assist pattern 40-4b and the twelfth sub-assist pattern 40-4c may be spaced apart from each other by the second distance S2a. Among the tenth to twelfth sub-assist patterns 40-4a, 40-4b, and 40-4c, the second distance S2a may be a minimum feature size. The tenth and twelfth sub-assist patterns 40-4b and 40-4c may be arranged in the second direction at a fifth pitch P1d. The first and second sub-patterns 30-1a and 30-1b may be arranged in the second direction at the second pitch P2a.

In some embodiments, the first width W1a may be greater than the fifth width W2b and the sixth width W2c of the fourth assist pattern 40-4 and/or the third width W3a of the second pattern 30-1 in the Y direction. In some embodiments, the fifth distance S1b may be greater than the second distance S2a and the third distance S3a. The fifth pitch P1d may be greater than the second pitch P2a.

In some embodiments, the first width W1a of the first pattern 20-1, for example, the first portion 20-1a may be no less than 100 times a minimum feature size of the fourth assist pattern 40-4 and/or the second pattern 30-1 in the Y direction, for example, one of the second distance S2a and the third width W3a.

In some embodiments, the fourth width W4a including the first portion 20-1a of the first pattern 20-1 and the fourth assist pattern 40-4 may be no less than 100 times the minimum feature size of the fourth assist pattern 40-4 and/or the second pattern 30-1 in the Y direction, for example, one of the second distance S2a and the third width W3a.

The semiconductor device 10-4 having the above layout includes the fifth sub-pattern area AR-1e including the fourth assist pattern 40-4 and connects the fourth assist pattern 40-4 to the first pattern 20-1. In the semiconductor device 10-4, although the tenth and eleventh sub-assist patterns 40-4a and 40-4b adhere to the first pattern 20-1, the first pattern 20-1 does not adhere to the second pattern 30-1.

Figure 18:
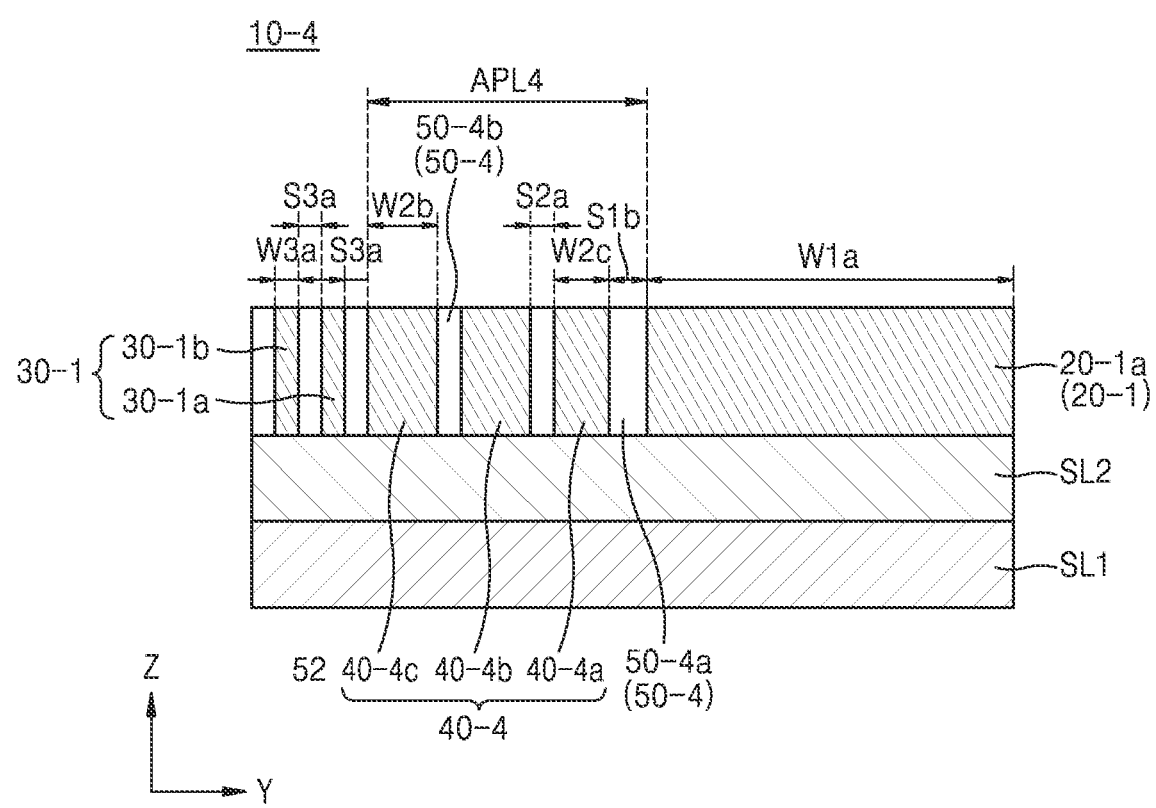
FIGS. 18 to 20 are cross-sectional views each illustrating a main portion of a semiconductor device respectively taken along lines XVIII-XVIII', XIX-XIX', and XX-XX' of FIG. 16.
Figure 19:
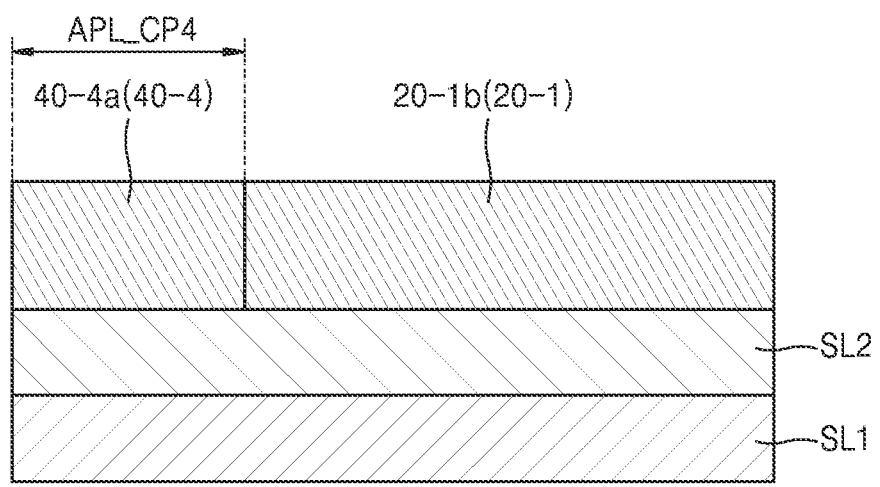
Figure 20:
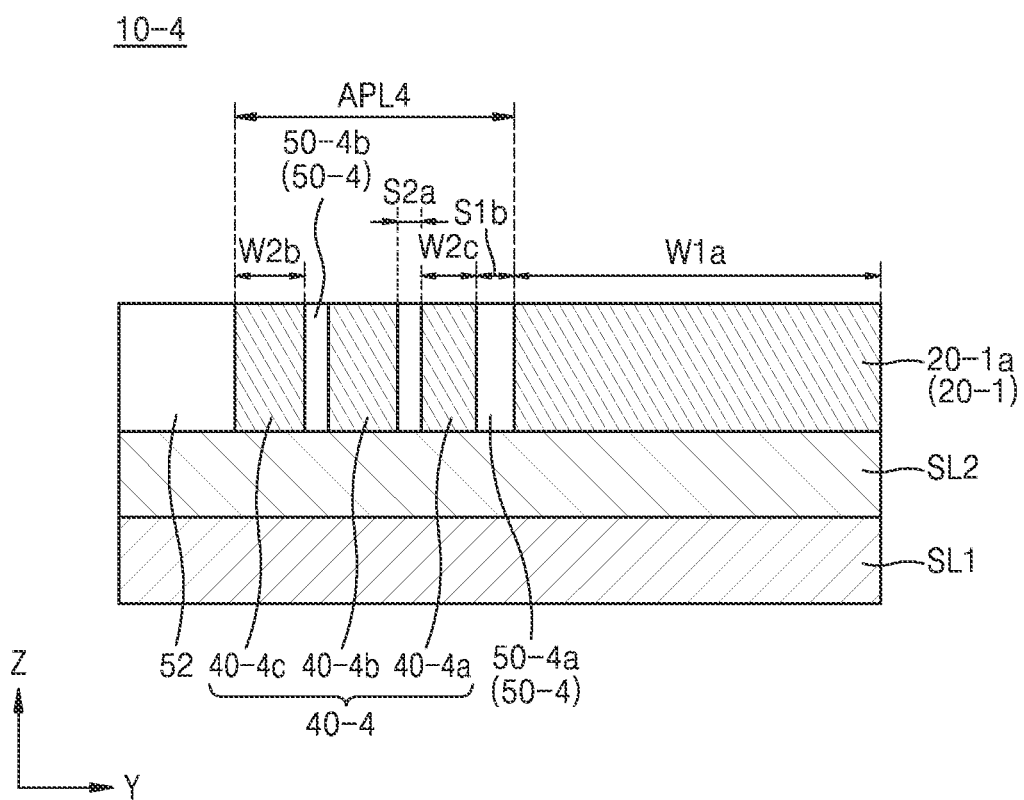

FIGS. 18 to 20 are cross-sectional views each illustrating a main portion of the semiconductor device 10-4 taken along each of the lines XVIII-XVIII', XIX-XIX', and XX-XX' of FIG. 16.

Specifically, in FIGS. 18 to 20, the same reference numerals as those of FIGS. 16 and 17 denote the same elements. In FIGS. 18 to 20, the same contents as those of FIGS. 16 and 17 are omitted or simply described. In FIGS. 18 to 20, a Z direction is perpendicular to an X-Y plane.

In the semiconductor device 10-4, the semiconductor layer SL2 may be positioned on the semiconductor substrate SL1. On the semiconductor layer SL2, the first pattern 20-1, the fourth assist pattern 40-4, the second pattern 30-1, the second separation layer 52, and the fifth separation layer 50-4 may be positioned.

As illustrated in FIG. 20, on the semiconductor layer SL2, the second pattern 30-1 is separated from the first pattern 20-1 by the fourth assist pattern area APL4 including the fourth assist pattern 40-4. The second pattern 30-1 may include the first sub-pattern 30-1a and the second sub-pattern 30-1b. The first sub-pattern 30-1a and the second sub-pattern 30-1b are separated by the second separation layer 52 and each of the first sub-pattern 30-1a and the second sub-pattern 30-1b has the third width W3a. The first sub-pattern 30-1a and the second sub-pattern 30-1b may be spaced apart from each other by the third distance S3a.

As illustrated in FIGS. 18 and 20, on the semiconductor layer SL2, the fourth assist pattern 40-4 may include the tenth sub-assist pattern 40-4a, the eleventh sub-assist pattern 40-4b, and the twelfth sub-assist pattern 40-4c spaced apart from each other in the Y direction. Each of the eleventh sub-assist pattern 40-4b and the twelfth sub-assist pattern 40-4c may have the fifth width W2b. The tenth sub-assist pattern 40-4a may have the sixth width W2c. The fifth width W2b may be greater than the sixth width W2c.

The tenth sub-assist pattern 40-4a, the eleventh sub-assist pattern 40-4b, and the twelfth sub-assist pattern 40-4c may be separated from each other by the fifth separation layer 50-4, that is, the eighth sub-separation layer 50-4b. The tenth sub-assist pattern 40-4a, the eleventh sub-assist pattern 40-4b, and the twelfth sub-assist pattern 40-4c may be spaced apart from each other by the second distance S2a. A width of the fifth separation layer 50-4 may correspond to the second distance S2a. The first sub-pattern 30-1a and the twelfth sub-assist pattern 40-4c may be spaced apart from each other by the third distance S3a.

The first pattern 20-1, that is, the first portion 20-1a may be positioned at one side of the fourth assist pattern area APL4. The tenth sub-assist pattern 40-4a may be spaced apart from the first pattern 20-1, that is, the first portion 20-1a by the fifth distance S1b. By making the fifth distance S1b greater than the second distance S2a or the third distance S3a, it is possible to prevent the first pattern 20-1 from adhering to the tenth sub-assist pattern 40-4a.

As illustrated in FIG. 19, on the semiconductor layer SL2, the fourth assist connection portion APL_CP4 forming the fourth assist pattern area APL4 may be positioned. The fourth assist connection portion APL_CP4 may be connected to the first pattern 20-1, that is, the second portion 20-1b. In the semiconductor device 10-4, although the tenth and eleventh sub-assist patterns 40-4a and 40-4b adhere to the first pattern 20-1, the first pattern 20-1 and the second pattern 30-1 may not adhere to each other.

While the inventive concept has been particularly shown and described with reference to embodiments thereof, it will be understood that various changes in form and details may be made therein without departing from the spirit and scope of the following claims.

What is claimed is:

1. A semiconductor device comprising:
a first metal wiring pattern area; and
a second metal wiring pattern area that does not overlap the first metal wiring pattern area in a plan view,
wherein the first metal wiring pattern area comprises a first pattern,
wherein the second metal wiring pattern area comprises a second pattern,
wherein the first metal wiring pattern area comprises an assist pattern comprising one or more lines,
wherein the assist pattern is spaced apart from the second pattern, is parallel with the second pattern, and is between the first pattern and the second pattern, and
wherein a first end of the assist pattern contacts the first pattern, and
wherein odd ones of a plurality of sub-patterns of the second pattern are at a first distance from a portion of the first pattern orthogonal to an extension of the odd ones of the plurality of sub-patterns and even ones of the plurality of sub-patterns of the second pattern are at a second distance from the portion of the first pattern, wherein the second distance is different from the first distance.

2. The semiconductor device of claim 1,
wherein the first pattern comprises a wide pattern with a first width, and
wherein each of the odd ones and each of the even ones of the plurality of sub-patterns of the second pattern and one line of the assist pattern have second and third widths, respectively, that are less than the first width of the first pattern.

3. The semiconductor device of claim 1,
wherein the first pattern has an inner circumference, and
wherein the first end of the assist pattern is connected to the inner circumference of the first pattern.

4. The semiconductor device of claim 1,
wherein the first pattern has an inner circumference, and
wherein one end of each of the plurality of sub-patterns of the second pattern is spaced apart from the inner circumference of the first pattern.

5. The semiconductor device of claim 1,
wherein the plurality of sub-patterns of the second pattern are spaced apart from each other, and
wherein respective first ends of ones of the odd and even ones of the sub-patterns are arranged in a zigzag pattern.

6. The semiconductor device of claim 1,
wherein the first pattern comprises a block,
wherein the assist pattern comprises a sub-assist patterns that are spaced apart from each other, and
wherein the plurality of sub-patterns are spaced apart from each other.

7. The semiconductor device of claim 6, wherein the first distance between the first pattern and a sub-assist pattern of the plurality of sub-assist patterns that is closest to the first pattern is greater than the second distance between adjacent ones of the plurality of sub-assist patterns.

8. The semiconductor device of claim 6,
wherein the first pattern has a first width,
wherein a second width of ones of the plurality of sub-assist patterns is equal to a third width of ones of the plurality of sub-patterns of the second pattern, and
wherein a second distance between two of the plurality of sub-assist patterns that are adjacent one another is equal to a third distance between two of the plurality of sub-patterns of the second pattern that are adjacent one another.

9. The semiconductor device of claim 6,
wherein a second width of ones of the plurality of sub-assist patterns is equal to a third width of ones of the plurality of sub-patterns of the second pattern, and
wherein a fourth distance between two of the plurality of sub-assist patterns that are adjacent one another is greater than a third distance between two of the plurality of sub-patterns of the second pattern that are adjacent one another.

10. The semiconductor device of claim 6,
wherein a fifth width of ones of the plurality of sub-assist patterns is greater than a third width of ones of the plurality of sub-patterns of the second pattern, and
wherein a second distance between two of the plurality of sub-assist patterns that are adjacent one another is equal to a third distance between two of the plurality of sub-patterns of the second pattern that are adjacent one another.

11. The semiconductor device of claim 6,
wherein a width of a first sub-assist pattern of the plurality of sub-assist patterns is different from a width of a second sub-assist pattern of the plurality of sub-assist patterns,
and
wherein a second distance between adjacent ones of the plurality of sub-assist patterns is equal to a third distance between adjacent ones of the plurality of sub-patterns of the second pattern.

12. A semiconductor device comprising:
a first metal wiring pattern area; and
a second metal wiring pattern area that does not overlap the first metal wiring pattern area in a plan view and comprises a second pattern comprising one or more lines,
wherein the first metal wiring pattern area comprises:
a first sub-pattern area comprising a first pattern; and
a second sub-pattern area that is adjacent to the first sub-pattern area,
wherein the second sub-pattern area comprises an assist pattern comprising a plurality of sub-assist patterns that are in parallel with the second pattern and are connected to the first pattern, and
wherein odd ones of a plurality of sub-patterns of the second pattern are at a first distance from a portion of the first pattern orthogonal to an extension of the odd ones of the plurality of sub-patterns and even ones of the plurality of sub-patterns of the second pattern are at a second distance from the portion of the first pattern, wherein the second distance that is different from the first distance.

13. The semiconductor device of claim 12,
wherein the first pattern comprises a block having a wide pattern with a first width, and
wherein each of the odd ones and each of the even ones of the plurality of sub-patterns of the second pattern and one line of the assist pattern have second and third widths, respectively, that are less than the first width of the first pattern.

14. The semiconductor device of claim 12, wherein the second sub-pattern area and the second metal wiring pattern area are each lines and spaces pattern areas that comprises lines that are spaced apart from one another.

15. The semiconductor device of claim 12,
wherein the plurality of sub-patterns of the second pattern are spaced apart from each other.

16. The semiconductor device of claim 15,
wherein a width of any one of the plurality of sub-assist patterns is equal to a width of any one of the plurality of sub-patterns, and
wherein a distance between any two adjacent ones of the plurality of sub-assist patterns is equal to a distance between any two adjacent ones of the plurality of sub-patterns.

17. The semiconductor device of claim 13,
wherein the first pattern further comprises a portion adjacent to the assist pattern in a plan.

18. The semiconductor device of claim 12, wherein a first distance between the first pattern and a sub-assist pattern of the plurality of sub-assist patterns that is closest to the first pattern is greater than a second distance between adjacent ones of the plurality of sub-assist patterns.

19. A semiconductor device comprising:
a first metal wiring pattern area; and
a second metal wiring pattern area that does not overlap the first metal wiring pattern area in a plan view,
wherein the first metal wiring pattern area comprises a first pattern comprising a block,
wherein the second metal wiring pattern area comprises a second pattern that is spaced apart from the first pattern in a first direction and the second pattern comprises a plurality of sub-patterns comprising a plurality of lines spaced apart from each other in the first direction,
wherein, the first metal wiring pattern area comprises an assist pattern that is between the first pattern and the second pattern in the first direction,
wherein the assist pattern comprises a plurality of sub-assist patterns comprising a plurality of lines in parallel with the plurality of sub-patterns of the second pattern extending in a second direction perpendicular to the first direction, and spaced apart from each other in the first direction and,
wherein the plurality of sub-assist patterns are connected to the first pattern, and
wherein first side ends of the plurality of sub-patterns of the second pattern are arranged in a zigzag pattern in the first direction such that odd ones of the plurality of sub-patterns of the second pattern are at a first distance from the first pattern in the second direction and even ones of the plurality of sub-patterns of the second pattern are at a second distance from the first pattern in the second direction, wherein the second distance is different from the first distance.

20. The semiconductor device of claim 19,
wherein the first pattern comprises a first inner circumference in the first direction and a second inner circumference in the second direction,
wherein side ends of the plurality of sub-patterns of the second pattern are spaced apart from the second inner circumference, and
wherein one end of ones of the plurality of sub-assist patterns is connected to the second inner circumference.

* * * * *